US006986261B2

(12) United States Patent
Sasaki et al.

(10) Patent No.: US 6,986,261 B2
(45) Date of Patent: Jan. 17, 2006

(54) METHOD AND SYSTEM FOR CONTROLLING CHILLER AND SEMICONDUCTOR PROCESSING SYSTEM

(75) Inventors: Norikazu Sasaki, Nirasaki (JP); Hiroshi Koizumi, Nirasaki (JP); Norihiko Amikura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 71 days.

(21) Appl. No.: 10/712,043

(22) Filed: Nov. 14, 2003

(65) Prior Publication Data

US 2004/0216475 A1 Nov. 4, 2004

Related U.S. Application Data

(60) Provisional application No. 60/456,232, filed on Mar. 21, 2003, and provisional application No. 60/456,231, filed on Mar. 21, 2003.

(30) Foreign Application Priority Data

| Nov. 15, 2002 | (JP) | ......................................... | 2002-332800 |
| Mar. 19, 2003 | (JP) | ......................................... | 2003-076103 |
| Mar. 19, 2003 | (JP) | ......................................... | 2003-076104 |
| Mar. 19, 2003 | (JP) | ......................................... | 2003-076105 |

(51) Int. Cl.
*F25D 17/02* (2006.01)

(52) U.S. Cl. ............................. 62/201; 62/180; 62/185; 62/259.2; 165/268; 361/699

(58) Field of Classification Search ................. 62/157, 62/180, 185, 201, 259.2; 165/268; 361/688, 361/689, 699, 701

See application file for complete search history.

(56) References Cited

U.S. PATENT DOCUMENTS

| 5,724,825 | A | * | 3/1998 | Lee et al. | ...................... 62/185 |
| 6,684,652 | B2 | * | 2/2004 | Kim et al. | ..................... 62/185 |
| 2004/0070938 | A1 | * | 4/2004 | Hazelton et al. | ............ 361/688 |

FOREIGN PATENT DOCUMENTS

JP 2001-44176 2/2001

* cited by examiner

*Primary Examiner*—Marc Norman
(74) *Attorney, Agent, or Firm*—Oblon, Spivak, McClelland, Maier & Neustadt, P.C.

(57) ABSTRACT

A semiconductor processing system includes a control section that refers to recipe information on a process sequence, thereby detects that a processing apparatus will shift from an ordinary operation state to a long idle state, and switches thermo-medium circulation apparatus from an ordinary mode to an energy-saving mode after the shift to the long idle state. The control section refers to recipe information on the process sequence or another process sequence, thereby detects that the processing apparatus will shift from the long idle state to the ordinary operation state, and switches the thermo-medium circulation apparatus from the energy-saving mode to the ordinary mode before the shift to the ordinary operation state. A thermo-medium is circulated at a first flow rate and at a second flow rate smaller than the first flow rate in the ordinary mode and the energy-saving mode, respectively.

20 Claims, 22 Drawing Sheets

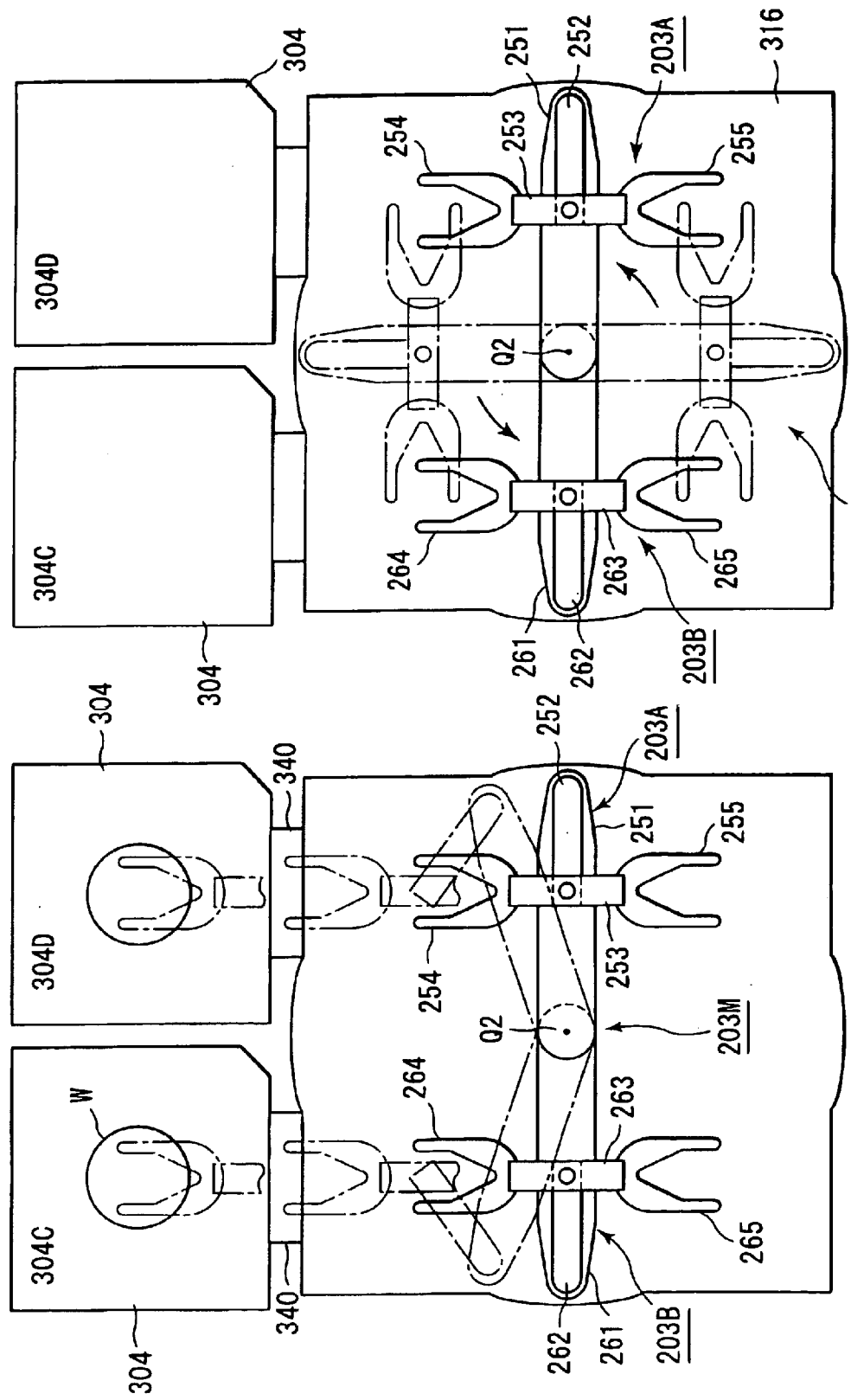

US 6,986,261 B2

METHOD AND SYSTEM FOR CONTROLLING CHILLER AND SEMICONDUCTOR PROCESSING SYSTEM

CROSS-REFERENCE TO RELATED APPLICATIONS

This application claims the benefit of U.S. Provisional Applications No. 60/456,231, filed Mar. 21, 2003; and No. 60/456,232, filed Mar. 21, 2003.

This application is based upon and claims the benefit of priority from the prior Japanese Patent Applications No. 2002-332800, filed Nov. 15, 2002; No. 2003-76103, filed Mar. 19, 2003; No. 2003-76104, filed Mar. 19, 2003; and No. 2003-76105, filed Mar. 19, 2003, the entire contents of all of which are incorporated herein by reference.

BACKGROUND OF THE INVENTION

1. Field of the Invention

The present invention relates to a method and apparatus for controlling a chiller, which is used for temperature-adjusting a processing apparatus, and particularly, to an energy-saving technique for efficiently reducing the energy consumed by the chiller. The present invention also relates to a semiconductor processing system having a thermo-medium circulation apparatus. The term "semiconductor process" used herein includes various kinds of processes which are performed to manufacture a semiconductor device or a structure having wiring layers, electrodes, and the like to be connected to a semiconductor device, on a substrate, such as a semiconductor wafer or an glass substrate for an LCD (Liquid crystal display) or FPD (Flat Panel Display), by forming semiconductor layers, insulating layers, and conductive layers in predetermined patterns on the substrate.

2. Description of the Related Art

A plasma processing apparatus for a semiconductor process is a typical example of a processing apparatus employing a chiller. A plasma processing apparatus is widely used for a process, such as etching, deposition, oxidation, or sputtering, in the process of manufacturing semiconductor devices, LCDs, or FPDs. A plasma processing apparatus includes one or a pair of electrodes disposed in a reaction container or chamber, for generating plasma or attracting ions. The electrode(s) is supplied with a radio frequency (RF) power. In general, an electrode disposed at the center of the chamber and facing upward also functions as a worktable or susceptor for placing a substrate (a semiconductor wafer, glass substrate, or the like) thereon.

Since such a susceptor electrode comes into direct contact with a substrate, the electrode temperature has a direct influence on the substrate temperature, i.e., process temperature. Jpn. Pat. Appln. KOKAI Publication No. 2001-44176 discloses a structure in which a cooling medium room is formed in a susceptor electrode or in a conductive support member integrated therewith. A liquid or gaseous cooling medium set at a predetermined temperature is circulated and supplied into the cooling medium room from an outer chiller unit, so as to control the electrode temperature (see its FIG. 1).

Conventionally, without reference to whether a processing apparatus is in an ordinary operation for processing a substrate, or an idle state (in a resting phase), a chiller keeps supplying the processing apparatus with a cooling medium at a constant flow rate (i.e., a flow rate for maintaining the temperature of a susceptor electrode or substrate at a set temperature). In this case, the chiller consumes unnecessary energy. Generally speaking, a long idle state of a processing apparatus is brought about between respective lots. In this respect, production lines for large item and small volume, widespread in recent years, may irregularly fall into a long idle state (several tens of minutes or more, as the case may be) even between respective substrates, i.e., single substrate processes. Accordingly, energy consumption of a chiller cannot be ignored in recent years.

BRIEF SUMMARY OF THE INVENTION

An object of the present invention is to suitably control the cooling medium supply operation of a chiller, in accordance with the operation state of a processing apparatus, thereby realizing effective energy-saving. Another object of the present invention is, in a semiconductor processing system including a thermo-medium circulation apparatus, to suitably control the thermo-medium supply operation, in accordance with the operation state of a processing apparatus, thereby realizing effective energy-saving in the processing system.

According to a first aspect of the present invention, there is provided a controlling method of controlling a chiller that supplies a cooling medium for temperature control to a processing apparatus for performing a predetermined process on a substrate, the controlling method comprising:

supplying the cooling medium at a first flow rate to the processing apparatus from the chiller when the processing apparatus ordinarily operates for the process;

referring to recipe information on a process sequence, thereby detecting that the processing apparatus will come into a long idle state that is an idle state longer than a predetermined threshold time period;

reducing a flow rate of the cooling medium from the first flow rate to a second flow rate smaller than the first flow rate after the processing apparatus switches from an ordinary operation state to the idle state; and returning the flow rate of the cooling medium back to the first flow rate from the second flow rate before the processing apparatus switches from the idle state to the ordinary operation state.

According to a second aspect of the present invention, there is provided a controlling apparatus for controlling a chiller that supplies a cooling medium for temperature control through a cooling medium circulation passage to a processing apparatus for performing a predetermined process on a substrate, the controlling apparatus comprising:

cooling medium flow rate adjusting means for adjusting a flow rate of the cooling medium supplied from the chiller to the processing apparatus;

first sequence detecting means for referring recipe information on a process sequence, thereby detecting that the processing apparatus will come into a long idle state that is an idle state longer than a predetermined threshold time period;

cooling medium flow rate reducing means for controlling, in accordance with a detection result obtained by the first sequence detecting means, the cooling medium flow rate adjusting means to reduce a flow rate of the cooling medium from a first flow rate for an ordinary operation state of the processing apparatus to a second flow rate smaller than the first flow rate after the processing apparatus switches from the ordinary operation state to the idle state; and cooling medium flow rate returning means for controlling the cooling medium flow rate adjusting means to return the flow rate of the cooling medium back to the first flow rate from the second flow rate before the processing apparatus switches from the idle state to the ordinary operation state.

According to a third aspect of the present invention, there is provided a semiconductor processing system, comprising:

a processing apparatus configured to perform a predetermined semiconductor process on a substrate, the processing apparatus including a process chamber that accommodates the substrate, a susceptor that supports the substrate in the process chamber, a gas supply section that supplies a process gas into the process chamber, and an exhaust section that exhausts an interior of the process chamber;

a thermo-medium circulation apparatus configured to circulate a thermo-medium through the susceptor to control temperature of the susceptor;

a control section to control an operation of the processing apparatus and the thermo-medium circulation apparatus;

wherein the control section switches the thermo-medium circulation apparatus between an ordinary mode and an energy-saving mode in correspondence with an ordinary operation state and a long idle state of the processing apparatus, respectively, the long idle state is an idle state of the processing apparatus longer than a predetermined threshold time period, and the thermo-medium is circulated at a first flow rate and at a second flow rate smaller than the first flow rate in the ordinary mode and the energy-saving mode, respectively, wherein the control section refers to recipe information on a process sequence, thereby detects that the processing apparatus will shift from the ordinary operation state to the long idle state, and switches the thermo-medium circulation apparatus from the ordinary mode to the energy-saving mode after the processing apparatus shifts to the long idle state, and wherein the control section refers to recipe information on the process sequence or another process sequence, thereby detects that the processing apparatus will shift from the long idle state to the ordinary operation state, and switches the thermo-medium circulation apparatus from the energy-saving mode to the ordinary mode before the processing apparatus shifts to the ordinary operation state.

In the first to third aspect, it is preferable that the threshold time period is set to be longer a time period that is a sum of a first time period necessary for switching from the first flow rate to the second flow rate, and a second time period necessary for switching from the second flow rate to the first flow rate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 25 is an explanatory diagram showing the extending/contracting action of the substrate transfer device;

FIG. 26 is an explanatory diagram showing a swivel motion of the substrate transfer device;

DETAILED DESCRIPTION OF THE INVENTION

[First Embodiment]

Figure 1:
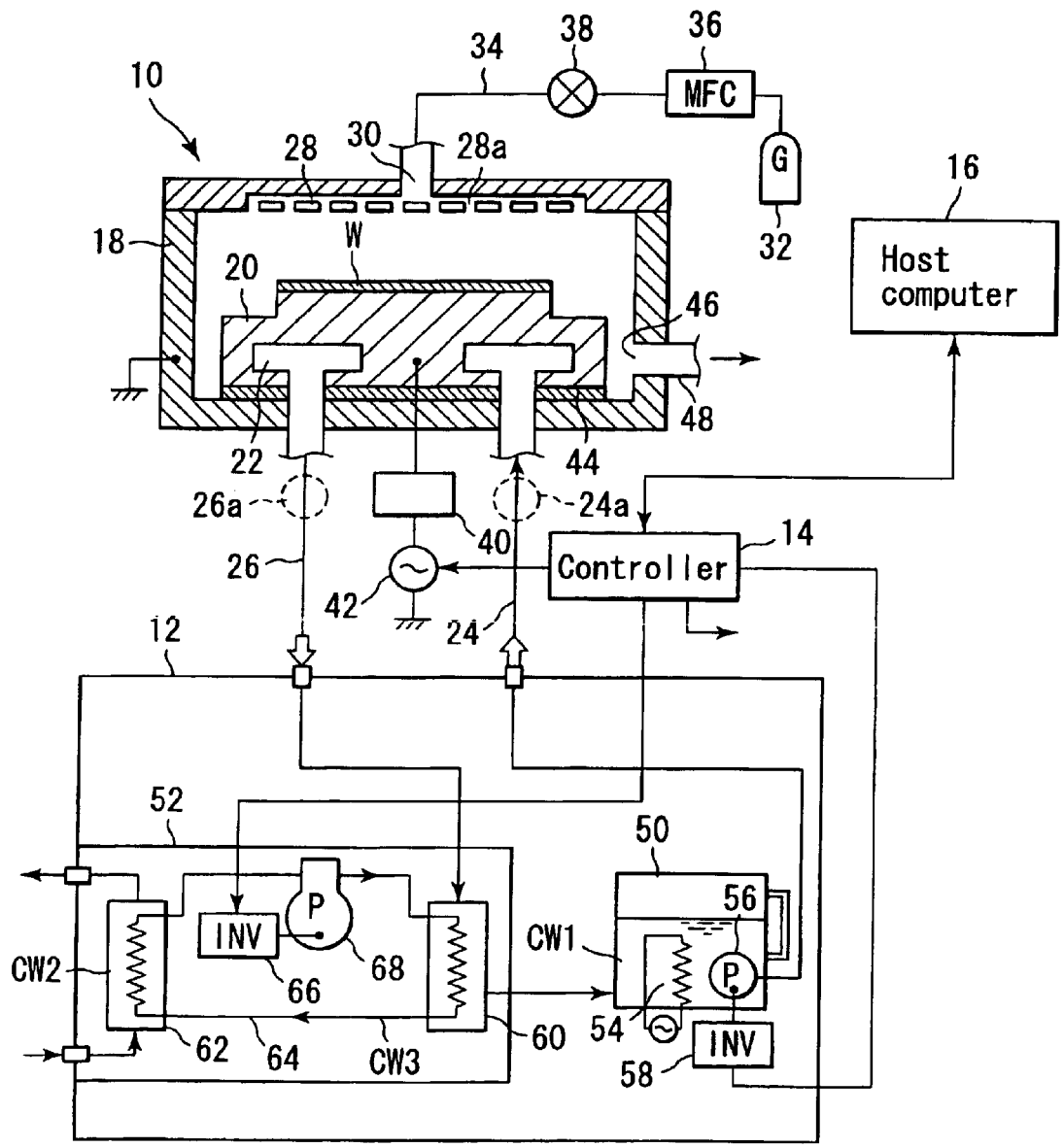
FIG. 1 is a view showing the structure of a semiconductor processing system according to a first embodiment of the present invention.

FIG. 1 is a view showing the structure of a semiconductor processing system according to a first embodiment of the present invention. This processing system includes a processing apparatus 10, a chiller unit 12, a controller 14, and a host computer 16.

For example, the processing apparatus 10 is structured as a plasma etching apparatus, and has a process chamber 18, which can be airtightly closed. A lower electrode 20 is disposed at the center of the process chamber 18, and functions also as a worktable (susceptor) for placing a substrate (e.g., a semi-conductor wafer) W thereon.

For example, the lower electrode 20 is formed of an aluminum plate block. The plate block is provided with a cooling medium room 22 formed therein, which, e.g., annularly extends in the angular direction. The cooling medium room 22 is connected to a cooling medium supply line 24 and cooling medium collection line 26 to form a cooling medium circulation passage. As described later, a cooling medium is temperature-adjusted by the chiller unit 12, and circulated and supplied into the cooling medium room 22 through the cooling medium supply line 24 and cooling medium collection line 26.

An upper electrode 28 is disposed above the lower electrode 20 in the process chamber 18, and faces the lower electrode 20 in parallel therewith. The upper electrode 28 is provided with a number of through holes or gas spouting ports 28a formed therein to constitute a showerhead. A gas feed port 30 is formed on the backside of the upper electrode 28 and connected to a gas supply line 34 from a process gas supply source 32. The gas supply line 34 is provided with a mass-flow controller (MFC) 36 and a switching valve 38 on the way.

The upper electrode 28 is connected to the grounded potential (grounded) through the process chamber 18. On the other hand, the lower electrode 20 is electrically connected to an RF power supply 42 through a matching device 40. The lower electrode 20 is electrically isolated from the process chamber 18 by an insulating body 44.

An exhaust port 46 is formed in the bottom of the process chamber 18. The exhaust port 46 is connected to an exhaust unit, such as a vacuum pump (not shown), through an exhaust line 48. A substrate transfer port (not shown) is formed in the sidewall of the process chamber 18. The substrate transfer port is connected to, e.g., a load-lock chamber (not shown) through a gate valve (not shown).

When the etching apparatus is used for an etching process, an operation is performed as follows, for example. Specifically, a substrate W is transferred into the process chamber 18 and placed on the lower electrode 20. The chamber 18 is supplied with an etching gas at a predetermined flow rate by the process gas supply source 32, while it is vacuum-exhausted by the exhaust unit, so that the pressure inside the chamber 18 is adjusted to a set value. Furthermore, the lower electrode 20 is supplied with an RF power of, e.g., 13.56 MHz at a predetermined power level by the RF power supply 42.

As a result, the etching gas delivered from the showerhead 28a of the upper electrode 28 is turned into plasma by means of glow discharge between the electrodes. The plasma generates radicals and ions, by which the target surface of the substrate W is etched. For the etching process, the controller 14 performs the ON/OFF control over the etching gas supply (the ON/OFF control over the switching valve 38), and the ON/OFF control over the RF power (the ON/OFF control over the RF power supply 42).

The chiller unit 12 includes a cooling medium tank 50 for storing a liquid cooling medium (such as cooling water or brine) CW1. The cooling medium tank 50 is provided with a heater 54 for heating the cooling medium CW1 in the tank, and a pump 56 for delivering the cooling medium CW1 into the cooling medium supply line 24. The pump 56 is driven and controlled by an inverter 58, so that it delivers the cooling medium CW1 from the tank 50 at a predetermined pressure or flow rate. The controller 14 controls the output of the pump 56, i.e., the delivery flow rate, through the inverter 58.

The chiller unit 12 also includes a cooler 52 for adjusting the temperature of the cooling medium CW1. The cooler 52 includes a first heat exchanger 60, a second heat exchanger 62, and a cooling medium circulation passage 64. The first heat exchanger 60 cools the cooling medium CW1 collected by the cooling medium collection line 26 to a predetermined temperature and returns it to the cooling medium tank 50. The second heat exchanger 62 is supplied with a second cooling medium CW2 having a temperature lower than the cooling medium CW1 by outer cooling medium supply means (not shown). The cooling medium circulation passage 64 circulates a third cooling medium CW3 used for exchanging heat between the first heat exchanger 60 and second heat exchanger 62. The cooling medium circulation passage 64 is provided with a pump 68 for this circulation, which is driven and controlled by an inverter 66.

The controller 14 controls the output of the pump 68, i.e., the circulation rate of the third cooling medium CW3, through the inverter 66, so as to set the cooling medium CW1 at a predetermined temperature in the cooling medium tank 50. A temperature sensor (not shown) may be provided to detect the temperature of the cooling medium CW1 in the cooling medium tank 50, cooling medium supply line 24, or cooling medium collection line 26, so that the temperature of the cooling medium CW1 is adjusted by means of feedback control. Furthermore, as indicted by broken lines in FIG. 1, flow rate sensors 24a and 26a may be provided on the cooling medium circulation passage (24, 26), so that the flow rate of the cooling medium CW1 is adjusted by means of feedback control (using a software).

The host computer 16 comprehensively controls the entire processing system, which the etching apparatus 10 belongs to. The host computer 16 controls the operations of the etching apparatus 10 and peripheral units thereof (particularly the chiller unit 12) through the controller 14. The host computer 16 can also control other processing apparatuses and transfer devices in the system, through the corresponding controllers.

The host computer 16 administrates recipe information on process sequences for respective substrates W by means of a look-ahead fashion (pre-fetch fashion) to control the operations of the apparatuses. The process sequences are inputted into the host computer 16 in advance by an operator, for example in a unit of sequences whose time schedules are decided.

On the basis of recipe information on the process sequences, the host computer 16 supplies the respective apparatus controllers with signals for instructing necessary operations or events, as needed. The apparatuses supply, through the controllers, the host computer 16 with operational situations of the apparatuses, process situations of substrates W being currently handled, or the like. The host computer 16 can grasp the present positions of substrates W being handled in the system, and renew information on the present positions in the process recipe information, as needed.

Figure 2:
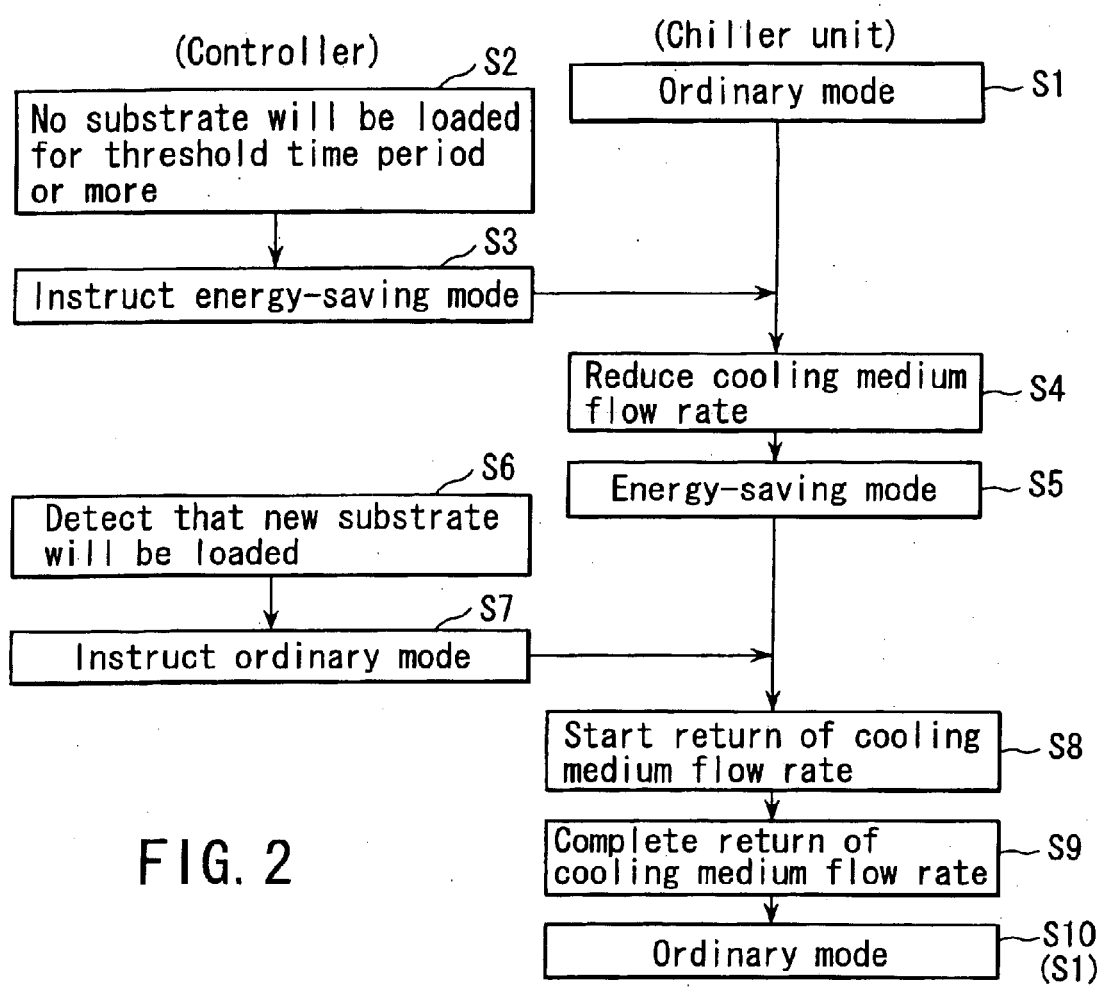
FIG. 2 is a flowchart showing the main procedures of chiller control according to the first embodiment.
Figure 3:
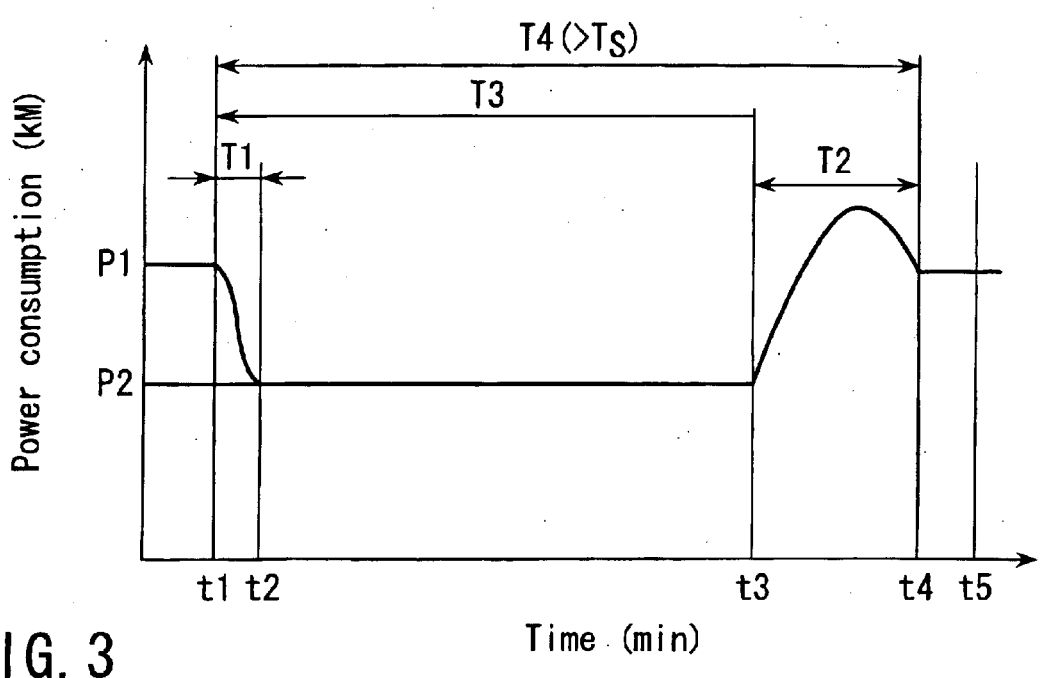
FIG. 3 is a timechart showing timing of the chiller control shown in FIG. 2, along with time characteristics of chiller power consumption.

FIG. 2 is a flowchart showing the main procedures of chiller control according to the first embodiment. FIG. 3 is a timechart showing timing of the chiller control shown in FIG. 2, along with time characteristics of chiller power consumption.

As shown in FIG. 2, when the etching apparatus 10 is in an ordinary operation state where it ordinarily operates for an etching process, the host computer 16 causes, through the controller 14, the chiller unit 12 to operate in an ordinary mode (step S1). In this ordinary mode, the cooling medium CW1 is circulated and supplied into the lower electrode (susceptor) 20 at a first flow rate N1 (for example, 25 liter/min).

More specifically, in the ordinary mode, the cooling medium CW1 is circulated and supplied from the chiller unit 12 through the cooling medium circulation passage (24, 26) into the cooling room 22 of the lower electrode 20, while it is temperature-adjusted at a predetermined temperature, under the control of the controller 14. At this time, the pump 56 of the cooling medium tank 50 in the chiller unit 12 acts at a considerably high output to secure a first flow rate N1. Also, the pump 68 of the cooler 52 acts at a relatively high output to rapidly perform heat exchange or cooling for the cooling medium CW1. As a consequence, a relatively high power P1 (for example, 3.31 kW) is consumed as a whole by the pumps 56 and 68, and the inverters 58 and 66.

It should be noted that a state where the etching apparatus 10 ordinarily operates for an etching process, i.e., the "ordinary operation state", means as follows. Specifically, as a matter of course, the ordinary operation state includes a time when a plasma process is performed on a substrate W placed on the lower electrode 20 in the process chamber 18. The ordinary operation state also includes a time when the substrate is being loaded/unloaded before and after the plasma etching process. The ordinary operation state may further include a standby state with which a plasma process can immediately start on a next substrate W if the next substrate W is loaded into the chamber 18.

According to the last definition, as long as the etching apparatus 10 is in the standby state, the chiller unit 12 keeps operating in the ordinary mode described above. Specifically, the chiller unit 12 operates in the ordinary mode in standby state, even if it is a state where no substrate W is present in the process chamber 18, the switching valve 38 of the process gas supply line 34 is closed, and the RF power supply 42 is OFF.

Returning back to FIG. 2, when the etching apparatus 10 is in the ordinary operation state, the host computer 16 looks ahead through recipe information on process sequences for respective substrates W, which are inputted and stored in the host computer 16 by an operator in advance. It is assumed, as a result, that the host computer 16 detects or concludes beforehand that the etching apparatus 10 is to come into a long idle state (step S2).

The "long idle state" means that the etching apparatus 10 is in a resting phase or in an idle state for a predetermined threshold time period Ts or more. In other words, the long idle state is a state where a next substrate W will not be loaded into the processing apparatus for a while. The long idle state includes not only a case where a next substrate loading time or timing has been decided, but also a case where such timing has not yet been decided. The "threshold time period Ts" is set at a certain value in consideration of time periods (T1 and T2) necessary for switching the cooling medium flow rate in the chiller unit 12, as described later.

As described above, the host computer 16 looks ahead through the recipe information to catch or detect beforehand a long idle state of the etching apparatus 10 (an idle state with the threshold time period Ts or more). In response to the long idle state of the etching apparatus 10, the host computer 16 causes, through the controller 14, the chiller unit 12 to operate in an energy-saving mode. In this energy-saving mode, the cooling medium CW1 is circulated and supplied into the lower electrode (susceptor) 20 at a second flow rate N2 (for example, 15 liter/min).

More specifically, in this case, in accordance with a communication from the host computer 16, the controller 14 transmits a signal for instructing the chiller unit 12 to operate in the energy-saving mode (step S3, time point t1). If the energy-saving mode instruction signal is thus transmitted, the chiller unit 12 reduces the flow rate of the cooling medium CW1 supplied to the etching apparatus 10, from the first flow rate N1 for the ordinary mode to the second flow rate N2 (for example, 15 liter/min) for the energy-saving mode (step S4, time point t2).

In the arrangement shown in FIG. 1, the controller 14 directly controls the inverter 58 to reduce the output of the pump 56 to a set value. The time period T1, which is necessary for switching the flow rate in this reduction, is determined by the output characteristics of the pump 56, the characteristics (specific gravity and so forth) of the cooling medium CW1, the flow rate change (from N1 to N2), the fluid capacity and conductance of the cooling medium circulation passage (24, 22, 26), and so forth. In general, the time period T1 is about one to two minutes.

While the etching apparatus 10 is in a long idle state, the temperature of the cooling medium CW1 collected through the cooling medium collection line 26 from the etching apparatus 10 is not so raised. Accordingly, the cooling power of the cooler 52 can be lowered during the energy-saving mode.

As described above, each section in the chiller unit 12 acts at a low output during the energy-saving mode. Particularly, the cooling medium CW1 of the cooling medium tank 50 is supplied into the etching apparatus 10 at the reduced flow rate N2, the pump 56 and inverter 58 are under lighter load and act at a far lower output, as compared to the ordinary mode. As a consequence, the entire power consumption of the pumps 56 and 68 and the inverters 58 and 66 decreases to a very low level P2 (for example, 2.26 kW).

Even if the chiller unit 12 is set in the energy-saving mode to reduce the flow rate of the cooling medium CW1 supplied to the etching apparatus 10, the temperature of the lower electrode 20 of the apparatus 10 is maintained at almost the same temperature as in the ordinary operation state. This is so, because, in the ordinary operation state, particularly during processing, the lower electrode 20 not only generates heat by itself due to RF current, but also receives heat from plasma. In this case, the lower electrode 20 requires a higher cooling rate, i.e., it requires the cooling medium CW1 to be circulated and supplied into the cooling room 22 at the first flow rate N1, which is relatively high.

On the other hand, in the long idle state, the lower electrode 20 does not generate heat by itself, or receive heat from plasma. In this case, even if the cooling rate is reduced that much, i.e., the flow rate of the cooling medium CW1 decreases, the temperature of the lower electrode 20 is maintained near the set temperature. To put it the other way around, the flow rate N2 of the cooling medium CW1 in the energy-saving mode is preferably set at a flow rate, with which the temperature of the lower electrode 20 is maintained near the temperature set value of the electrode in the ordinary operation state.

In the energy-saving mode, the interior of the process chamber 18 is preferably kept at a vacuum pressure of, e.g., 0.1 to 1 mTorr, to maintain the temperature of the lower electrode 20 near the set temperature. Where the lower electrode 20 is in a vacuum space, the thermal conductance around the lower electrode 20 becomes lower, thereby maintaining a thermally insulated state.

Returning back to FIG. 2, while the etching apparatus 10 is in a long idle state and the chiller unit 12 is in the energy-saving mode, the host computer 16 looks ahead through recipe information on process sequences. For example, the process sequences used here are new process sequences, which are inputted and stored in the host computer 16 by an operator after the etching apparatus 10 comes into the long idle state. Alternatively, these process sequences may be the process sequences described above, which are used for detecting the change of the etching apparatus 10 from the ordinary operation state to a long idle state.

It is assumed, as a result of looking ahead through recipe information on the process sequences, that the host computer 16 catches or detects beforehand that a new substrate W will be loaded to receive an etching process in the etching apparatus 10 (step S6). In this case, the host computer 16 supplies the controller 14 with an instruction for causing the chiller unit 12 to return to the ordinary mode, in response to the etching apparatus 10 returning to the ordinary operation state. For example, the host computer 16 transmits to the controller 14 a time to load the new substrate W into the process chamber 18. The host computer 16 may supply the controller 14 with etching process conditions (recipe) specific to the substrate W, as needed.

When the controller 14 receives the communication from the host computer 16, it sets a time point t5 to fully return the etching apparatus 10 from the long idle state to the ordinary operation state, before the substrate loading time indicated by the host computer 16. Further, the controller 14 supplies respective portions of the etching apparatus 10 with necessary instruction signals for them to return to the standby state. Furthermore, the controller 14 supplies the chiller unit 12 with an instruction signal for it to return from the energy-saving mode to the ordinary mode (step S7).

When the ordinary mode instruction signal is supplied, the chiller unit 12 starts an operation of returning the flow rate of the cooling medium CW1 supplied to the etching apparatus 10, back to the first flow rate N1 for the ordinary mode, from the second flow rate N2 for the energy-saving mode (step S8, time point t3). In the arrangement shown in FIG. 1, the controller 14 directly controls the inverter 58 to raise the output of the pump 56 to a set value. The time period T2, which is necessary for switching the flow rate in this return, is determined by the output characteristics of the pump 56, the characteristics (specific gravity and so forth) of the cooling medium CW1, the flow rate change (from N2 to N1), the fluid capacity and conductance of the cooling medium circulation passage (24, 22, 26), and so forth. In general, the time period T2 is about five to eight minutes. Accordingly, a time point t3 to start an operation of switching or returning the cooling medium flow rate is decided, so as for the cooling medium flow rate to fully return to the first flow rate N1 (for example, at a time point t4) before a time point t5 when the etching apparatus 10 fully returns to the ordinary operation state (step S9).

By doing so, the chiller unit 12 returns back to the ordinary mode (step S10). As a consequence, the etching apparatus 10 can come into the standby state in time for a substrate loading time indicated by the host computer 16.

According to the sequence shown in FIG. 3, in a long idle state, the host computer 16 looks ahead through recipe information on process sequences to detect timing for the etching apparatus 10 to return from the long idle state to the ordinary operation state. In this case, a time period T4 from the time point t1 to the time point t4 is indefinite, wherein the chiller unit 12 is instructed to reduce the cooling medium flow rate at the time point t1 and is instructed to return the cooling medium flow rate at the time point t4. This manner is preferable where the process sequences used here consist of new process sequences inputted after the etching apparatus 10 comes into long idle state.

On the other hand, there is a case where a long idle state can be detected from process sequences inputted at first. In this case, the time period length of the long idle state of the etching apparatus 10 may be calculated when the chiller unit 12 is switched from the ordinary mode to the energy-saving mode. In this case, accordingly, the time periods T3 and T4 may be set in advance by a timer function of the controller 14.

There is a case where a very long idle state of the etching apparatus 10 is detected from the beginning. In this case, the flow rate of the cooling medium CW1 may be controlled to further decrease from the second flow rate N2, as long as it does not hinder restoration. Alternatively, in this case, the respective portions of the chiller unit 10 may completely stop operating.

As described above, when the chiller unit 12 switches the flow rate of the cooling medium CW1 between the first flow rate N1 for the ordinary mode and the second flow rate N2 for the energy-saving mode, a considerable time period (T1, T2) is required. Accordingly, a "threshold time period Ts" set on the time period length of an idle state of the etching apparatus 10, which is a turning point for switching the chiller unit 12 from the ordinary mode to energy-saving mode, is preferably selected to be longer than the time period for switching the flow rate (a predetermined time period T1+T2).

As described above, according to the first embodiment, looking ahead through recipe information on process sequences is used to catch (or detect) that a processing apparatus will come into a long idle state (an idle state of predetermined threshold time period or more). Then, the flow rate of a cooling medium supplied from a chiller unit to the processing apparatus is reduced and kept at a suitably low flow rate for a suitable time period. As a consequence, it is possible to realize considerable energy-saving of the chiller.

In the first embodiment, only the lower electrode 20 of the etching apparatus 10 is temperature-adjusted by the chiller unit 12. The upper electrode 28 may be also temperature-adjusted by the chiller unit 12, where cooling medium room and cooling medium passages similar to those described above are provided for it. Furthermore, a part or member other than the electrodes may be temperature-adjusted by a chiller.

The arrangement of the chiller unit 12 according to the first embodiment is only one example, and can be variously changed or modified. For example, the liquid cooling medium CW1 supplied to the plasma etching apparatus 10 may be replaced with a gaseous cooling medium, while replacing the pump 56 with a compressor. The plasma etching apparatus 10 is also only one example of a processing apparatus. The first embodiment may be applied to processing apparatuses of various types or uses (for example, CVD, oxidation, sputtering, and so forth).

Furthermore, the first embodiment can be applied in the same manner to either thermo-medium used as a cooling medium or a heating medium. In other words, the chiller of the first embodiment can be expressed as a unit for circulating a thermo-medium.

[Second Embodiment]

Figure 4:
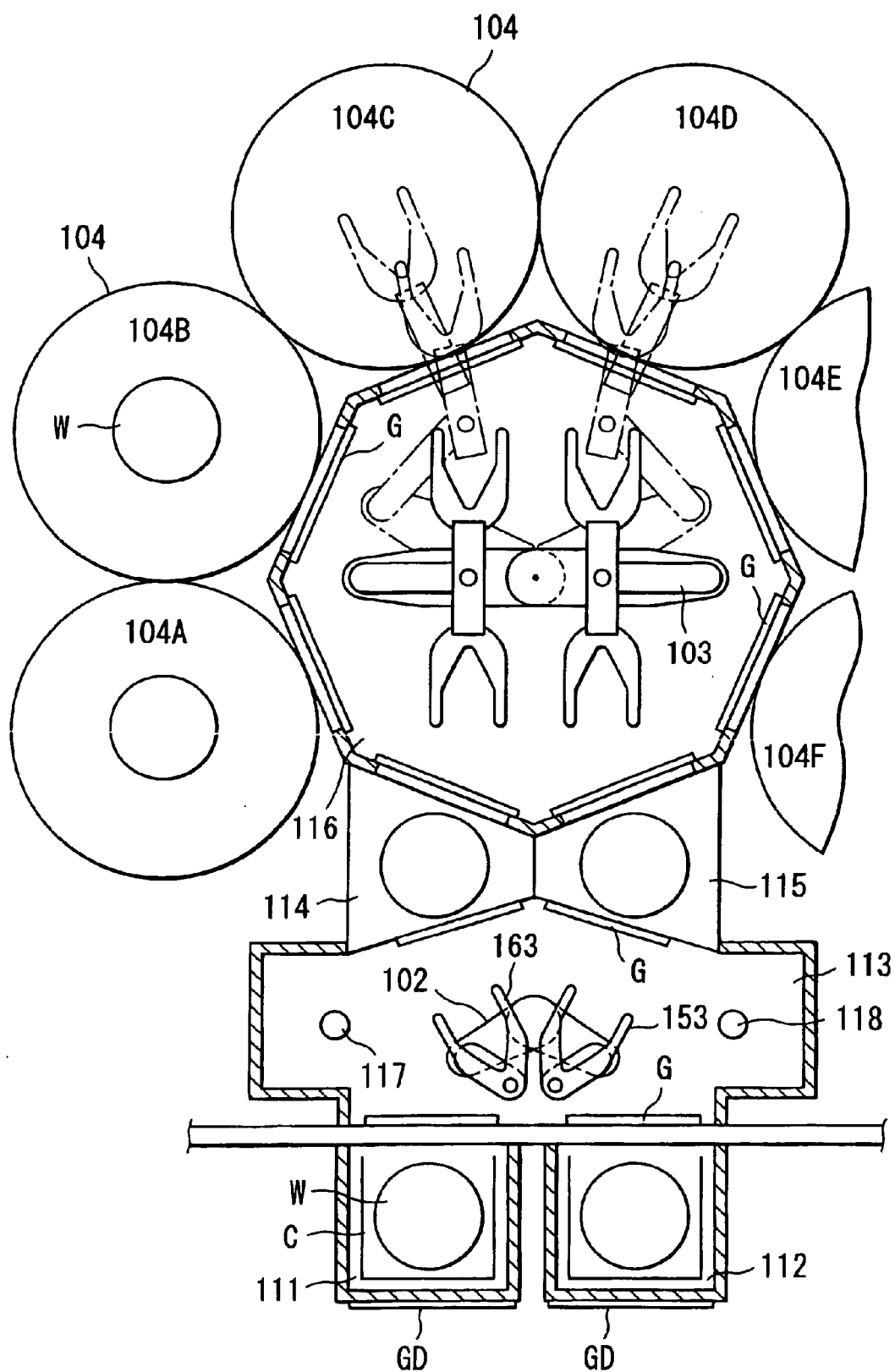
FIG. 4 is an overall plan view of a substrate processing device according to a second embodiment of the present invention.
Figure 5:
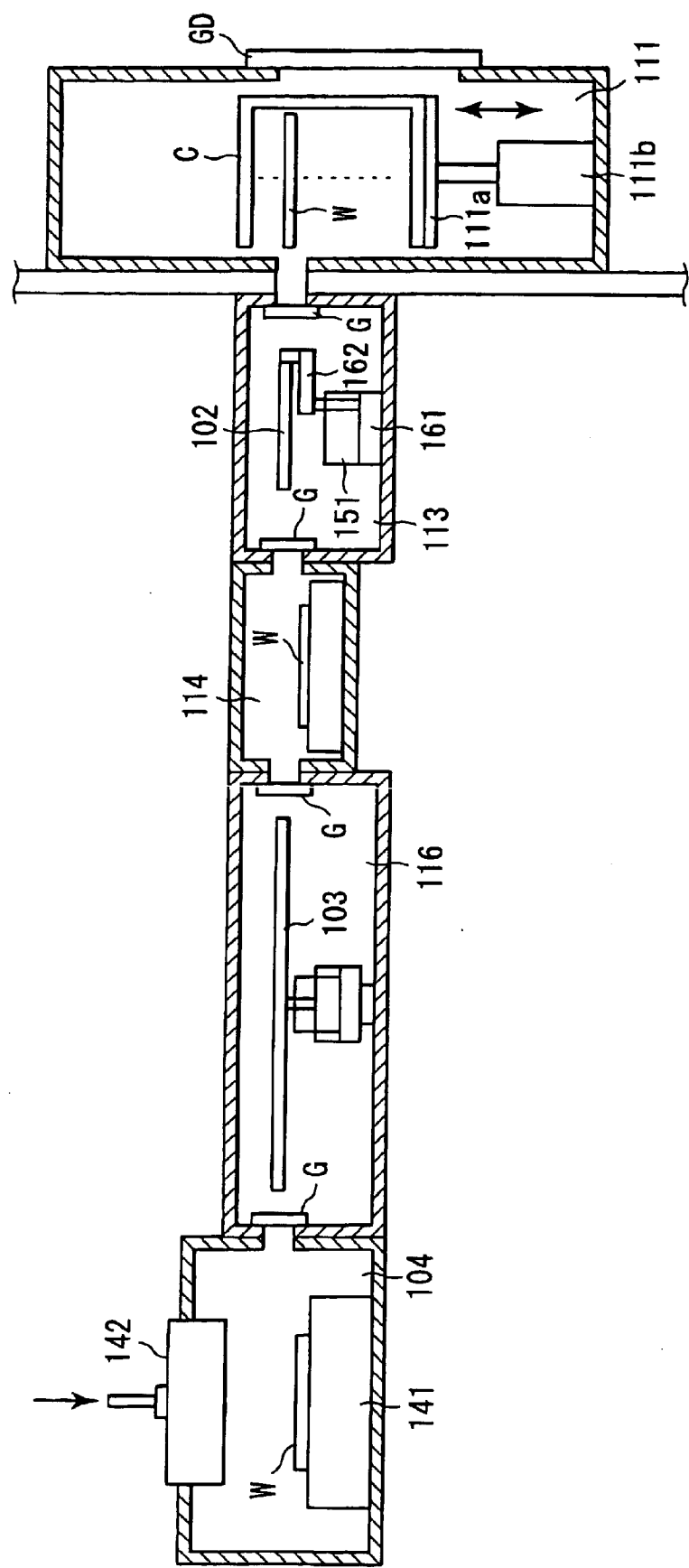
FIG. 5 is a schematic vertical cross-sectional view showing a sketch of the substrate processing device.

FIGS. 4 and 5 show a substrate processing device according to a second embodiment of the present invention. This substrate processing device has two cassette chambers 111 and 112 of airtight structure, into which are transferred cassettes (substrate transfer containers) C, which store multiple wafers, which are the substrates. These cassette chambers 111 and 112 are arranged aligned in a horizontal row, and therefore the cassettes C that are placed in them are aligned on a straight line to the left and right of each other. Cassette chambers 111 and 112 correspond to, respectively, the first substrate transfer container chamber, which forms the first placement area, and the second substrate transfer container chamber, which forms the second placement area.

Cassette chambers 111 and 112 each have a gate door GD on the atmosphere side, and the space with the atmosphere is airtightly partitioned by this gate door GD. Provided inside cassette chambers 111 and 112, as shown in FIG. 5, is elevator part 111b for raising and lowering cassette placement platform 111a and successively positioning the wafer retention grooves inside cassette C to the access level of the first transfer device, which is discussed below.

First transfer chamber 113, which is of airtight structure, is airtightly connected to the interior side of cassette chambers 111 and 112, and airtightly connected to this first transfer chamber 113, via first and second preliminary vacuum chambers 114 and 115, which are two load lock chambers (standby chambers) aligned to the left and right, is second transfer chamber 116, which is given a vacuum atmosphere. In this example, we describe the case of a so-called open cassette, but if a sealed cassette is used, a sealed cassette will be detachably connected to the side wall of transfer chamber 113, and this point is discussed below.

Provided inside first transfer chamber 113 are positioning stages 117 and 118 for rotating wafers W and aligning their orientation, and first substrate transfer device 102 for transferring wafers W between cassette chamber 111 and 112 and preliminary vacuum chambers 114 and 115 and positioning stages 117 and 118. The openings (transfer openings) on the first transfer chamber 113 side in first and second preliminary vacuum chambers 114 and 115 face toward swivel center Q1 of first substrate transfer device 102. Here, the fact that they face toward swivel center Q1 means that the openings of first and second preliminary vacuum chambers 114 and 115 are not aligned on a straight line but that as seen from above the layout forms a chevron, in other words, that they are arranged along mutually adjacent sides of a polygon. Also, cassette chambers 111 and 112 and first transfer chamber 113 are given, for example, an inert-gas atmosphere or a vacuum atmosphere.

Second transfer chamber 116 is formed in a polygonal shape, for example an octagonal shape, and provided inside it is second substrate transfer device 103. Connected airtightly to six of the sides of the octagon of this second transfer chamber 116 are vacuum chambers 104 (104A–104F), which are substrate process chambers, and connected to the remaining two sides are preliminary vacuum chambers 114 and 115. The composition of second substrate transfer device 103 is such that, for example, two wafers W can be passed simultaneously between vacuum chambers 104 (104A–104F) and preliminary vacuum chamber 114 and 115. In FIG. 4, vacuum chambers 104 are pictured, for convenience in illustration, as simple circles, but if circular chambers are actually used, a member that joins the chamber and second transfer chamber 116 and forms a transfer opening is interposed between them.

Vacuum chambers 104 may also be chambers in the shape of, for example, a quadrilateral. What can be cited as the vacuum processing that is done in vacuum chambers 104 includes, for example, etching by etching gas, film formation processing by film formation gas, and ashing by ashing gas. Provided inside a vacuum chamber 104, as shown in FIG. 5, are placement platform 141 onto which to place wafer W and gas supply part 142 for supplying processing gas, and the centers of the wafers W placed onto placement platforms 141 in vacuum chambers 104 lie on a circle whose center is the center of second transfer chamber 116.

Figure 6:
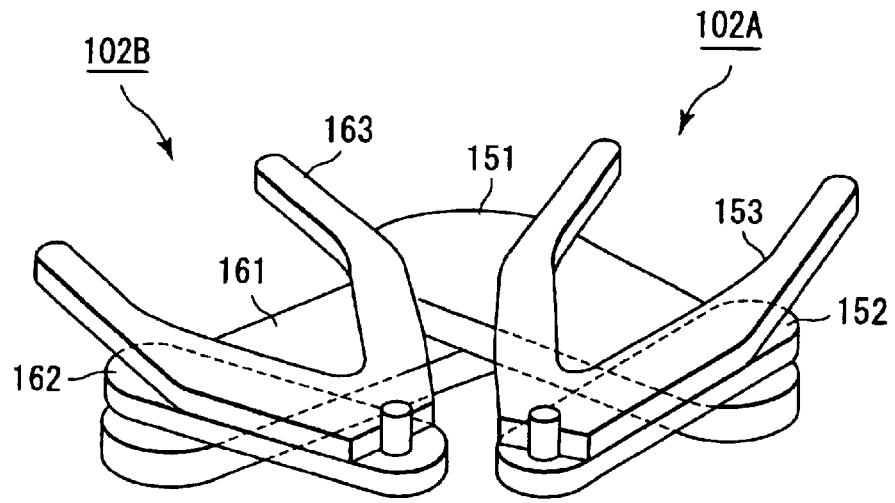
FIG. 6 is a schematic view showing a substrate transfer device according to the second embodiment of the present invention.
Figure 7:
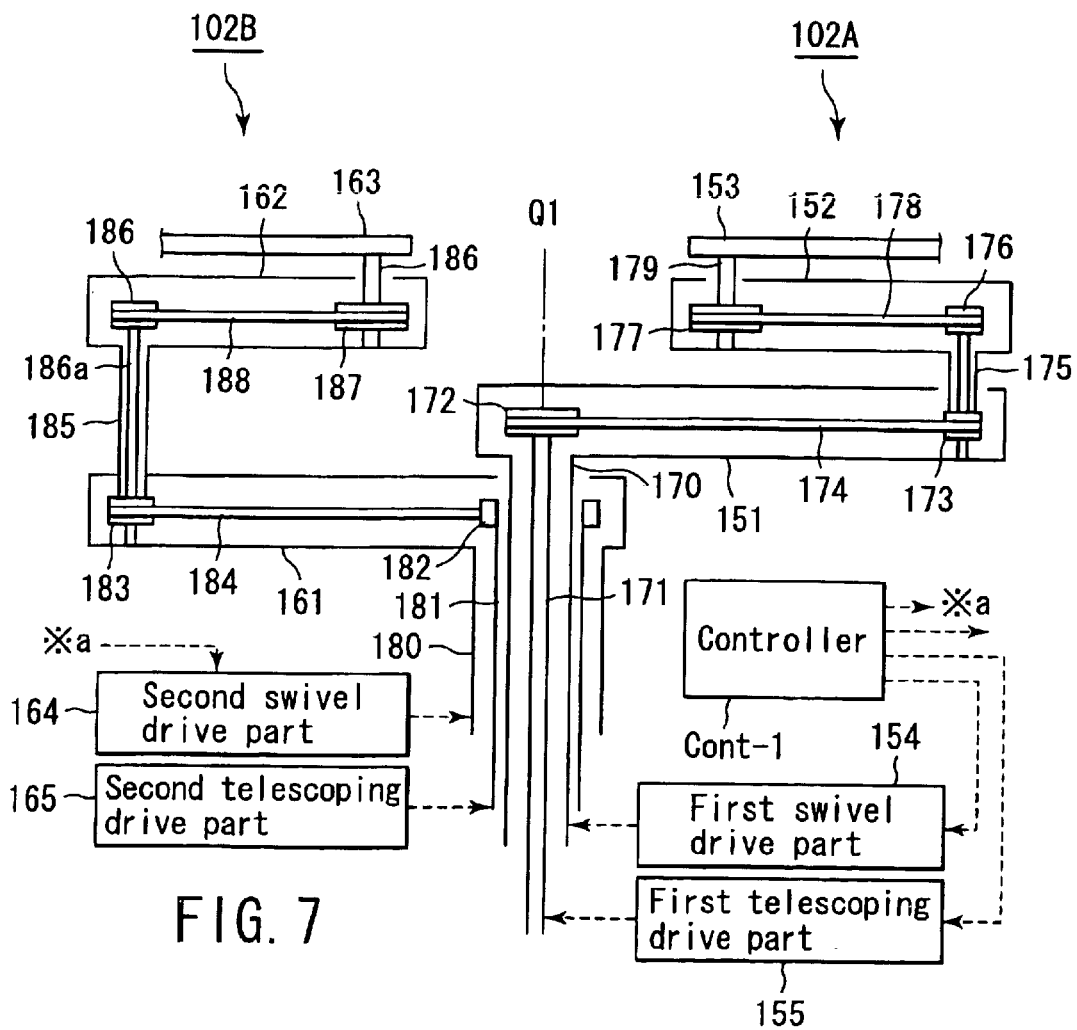
FIG. 7 is an explanatory diagram showing the transmission system of the substrate transfer device.

Next, we describe in detail first substrate transfer device 102, which is a substrate transfer device according to the second embodiment of the present invention. FIG. 6 and FIG. 7 show a general view and the transmission system, respectively, of first substrate transfer device 102. In this example, this substrate transfer device 102 has first multi-joint arm 102A, which forms the first transfer part, and second multi-joint arm 102B, which forms the second transfer part, and first multi-joint arm 102A has first swivel arm 151, whose swivel center Q1 is the center part of first transfer chamber 113 (see FIG. 4), middle arm 152, which is provided rotatably in the horizontal direction at the tip-end part of this swivel arm 151 and is constituted shorter than swivel arm 151, and first substrate holding arm (tip-end arm) 153, which is provided rotatably in the horizontal direction at the tip-end part of this middle arm 152 and is formed, for example, in fork shape.

Second multi-joint arm 102B, whose swivel center coincides with swivel center Q1 of said swivel arm 151, has swivel arm 161, which is provided below swivel arm 151 and comprises the second swivel part, middle arm 162, which is provided on this swivel arm 161 and is constituted shorter than swivel arm 161, and second substrate holding arm (tip-end arm) 163, which is provided on this middle arm 162. The structure of second multi-joint arm 102B is essentially the same as the structure of first multi-joint arm 102A, but it is different in, for example, the length of the rotation shaft of tip-end arm 163, in order to ensure that the height position of substrate holding arm 163 is made the same as substrate holding arm 153 of first multi-joint arm 102A, that is, in order to ensure that the composition is such that tip-end arms 153 and 163 transfer on the same plane.

First multi-joint arm 102A and second multi-joint arm 102B wait, forming a chevron shape, put in a position rotated forward from the position in which, in standard position, swivel arms 151 and 161 lie on a straight line with each other. And at this time the positions are set so that middle arms 152 and 162 are put in a position rotated rearward from the position in which they are parallel with swivel arms 151 and 161, substrate holding arms 153 and 163 are put in a position rotated slightly inward (toward the swivel center) from the position in which they are parallel with middle arms 152 and 162, and substrate holding arms 153 and 163 do not interfere with each other.

Describing the transmission system of first and second multi-joint arms 102A and 102B while referring to FIG. 7, the composition is such that swivel arm 151 of first multi-joint arm 102A swivels by cylindrical swivel shaft 170, whose center of rotation is swivel center Q1. Provided on the base-end side of swivel arm 151 is base-end pulley 172, which can rotate independently of swivel arm 151 by rotation shaft 171, whose center of rotation is swivel center Q1 and which is provided inside cylindrical swivel shaft 170. Provided rotatably on the tip-end part of swivel arm 151 is support pulley 173, which supports middle arm 152 and rotates integrally with middle arm 152, and this support pulley 173 is coupled to base-end pulley 172 by timing belt 174.

Affixed to the upper-end part of hollow rotation shaft 175, which is provided on the upper side of support pulley 173, is middle arm 152. Provided on the base-end part of middle arm 152, coaxially with said support pulley 173, is intermediate pulley 176, which for example is of the same diameter and has the same number of teeth as said support pulley 173, while provided rotatably on the tip-end part of middle arm 152 is tip-end pulley 177, and this tip-end pulley 177 is coupled to intermediate pulley 176 by timing belt 178. Intermediate pulley 176 is affixed to shaft part 176a, which passes through the interior of hollow rotation shaft 175 and is affixed to swivel arm 151. Affixed to the upper-end part of rotation shaft 179, which is provided on the upper side of tip-end pulley 177, is substrate holding arm 153.

The ratio of the number of teeth between base-end pulley 172 and support pulley 173 is set to, for example, 2.67:1, which is a value greater than 2, and the ratio of the number of teeth between intermediate pulley 176 and tip-end pulley 177 is set to 1:2. Because of this, substrate holding arm 153 assumes a locus that describes a curve, as discussed below.

In second multi-joint arm 102B, 180 is a cylindrical swivel shaft, 181 is a cylindrical rotation shaft, 182 is a base-end pulley, 183 is a support pulley, 184 is a timing belt, 185 is a rotation shaft, 186 is an intermediate pulley, 186a is a shaft part, 187 is a tip-end pulley, 188 is a timing belt, and 189 is a rotation shaft. Second multi-joint arm 102B is different from first multi-joint arm 102A in several points—for example, rotation shaft 181 of base-end pulley 182 is provided so as to surround swivel shaft 170 of first multi-joint arm 102A, and rotation shaft 189 of substrate holding arm 163 is longer than rotation shaft 179 of substrate holding arm 153 of first multi-joint arm 102A—but it is exactly the same as first multi-joint arm 102A in its composition that determines the transfer function. Therefore, the center of rotation of swivel shaft 180 and rotation shaft 181 is said swivel center Q1, and the ratio of the lengths of middle arm 162 and swivel arm 161, the ratio of the number of teeth between base-end pulley 182 and support pulley 183, and the ratio of the number of teeth between intermediate pulley 186 and tip-end pulley 187 are set similarly.

In FIG. 7, 154 and 155 are, respectively, the first swivel drive part, which drives swivel shaft 170, and the first telescoping drive part, which drives rotation shaft 171, in first multi-joint arm 102A, and 164 and 165 are, respectively, the second swivel drive part, which drives swivel shaft 180, and the second telescoping drive part, which drives rotation shaft 181, in second multi-joint arm 102B. These drive parts 154, 155, 164, and 165 correspond to mechanisms made up of motors, pulleys, and belts, etc., and are controlled by controller Cont-1.

Stored in controller Cont-1 is a program corresponding to the operation mode of first and second multi-joint arms 102A and 102B, and included in this operation mode are telescoping mode, which drives first and second telescoping drive parts 155 and 165 and causes them to perform telescoping operations; swivel mode which, in the state in which first and second multi-joint arms 102A and 102B are put in their standard positions, which are indicated by the solid lines in FIG. 4, drives first and second swivel drive parts 154 and 164 and performs swivel operations; and telescoping/swivel mode, which drives first and second telescoping drive parts 155 and 165 and causes them to perform telescoping operations, and in part of this, in this example, when wafers W are to be moved into cassettes C, simultaneously drives first and second telescoping drive parts 155 and 165 and first and second swivel drive parts 154 and 164.

Figure 8:
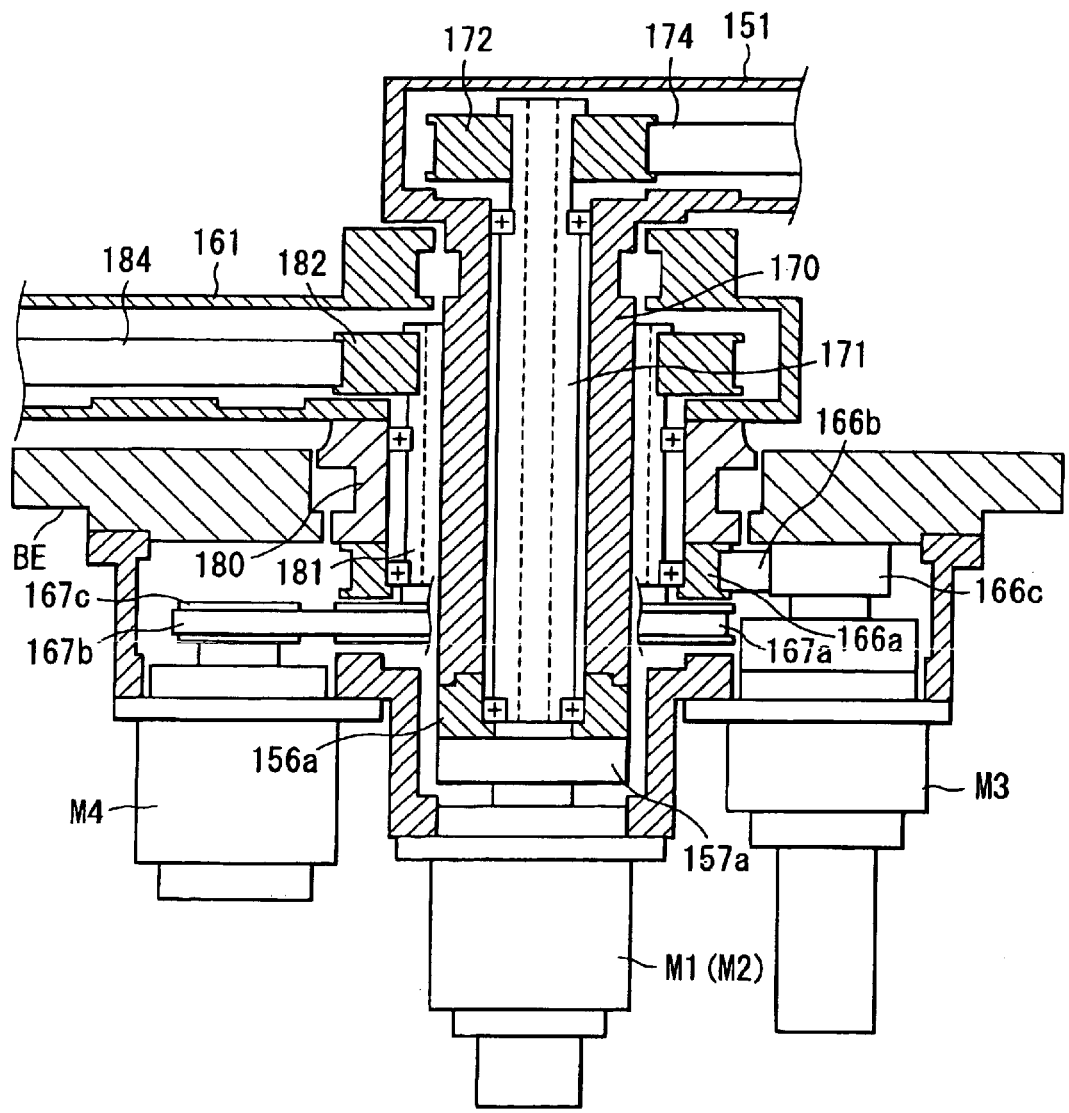
FIG. 8 is a cross-sectional view showing an example of the specific composition of part of the substrate transfer device.

FIG. 8 shows an example of the specific structure of swivel shafts 170 and 180 and rotation shafts 171 and 181 in first and second multi-joint arms 102A and 102B and related parts. In FIG. 8, 154a and 155a are pulleys for rotating swivel shaft 170 and rotation shaft 171, respectively, and they are driven by, respectively, motor M1 and motor M2, which is hidden behind this motor M1 and cannot be seen. 164a is a pulley that rotates swivel shaft 180, and it is driven by motor M3 via drive pulley 164c and belt 164b. 165a is a pulley that rotates rotation shaft 181, and it is driven by motor M4 via drive pulley 165c and belt 165b. Motors M1–M4 are affixed to base BE, which forms the floor of transfer chamber 113.

Returning now to FIG. 4 to briefly describe second substrate transfer device 103, which is arranged in second transfer chamber 116, second substrate transfer device 103 consists of first multi-joint arm 103A and second multi-joint arm 103B, which consist of three arms that can variously swivel and telescope, and tip-end arms 131A and 131B, which are positioned at the uppermost level, are able to hold wafers W on both sides. Also, first multi-joint arm 103A and second multi-joint arm 103B are so constructed that they move describing curves in a direction away from each other when tip-end arms 131A and 131B advance (retract) from their standard position, which is indicated by solid lines, making it possible to simultaneously pass wafers W to mutually adjacent chambers 104 and 104 or preliminary vacuum chambers 114 and 115.

Next, we describe the operation of the second embodiment. First, we discuss, among the operation modes in substrate transfer device 102, the previously mentioned telescoping mode. In first multi-joint arm 102A, when base-end pulley 172 is rotated, stopping with regard to first swivel drive part 154, which is the drive part of swivel shaft 170 (see FIG. 7) and operating (driving) with regard to first telescoping drive part 155, which is the drive part of rotation shaft 171, rotation shaft 175, which supports middle arm 152, tries to rotate. At this time, no rotation force is given from drive part 154, and swivel shaft 170 is in a free state (rotatable state), so, when base-end pulley 172 rotates clockwise at the solid-line position shown in FIG. 9, middle arm 152 tries to open up with respect to swivel arm 151, so it rotates clockwise as indicated by the dotted lines, and swivel arm 151 also rotates, counterclockwise.

Figure 9:
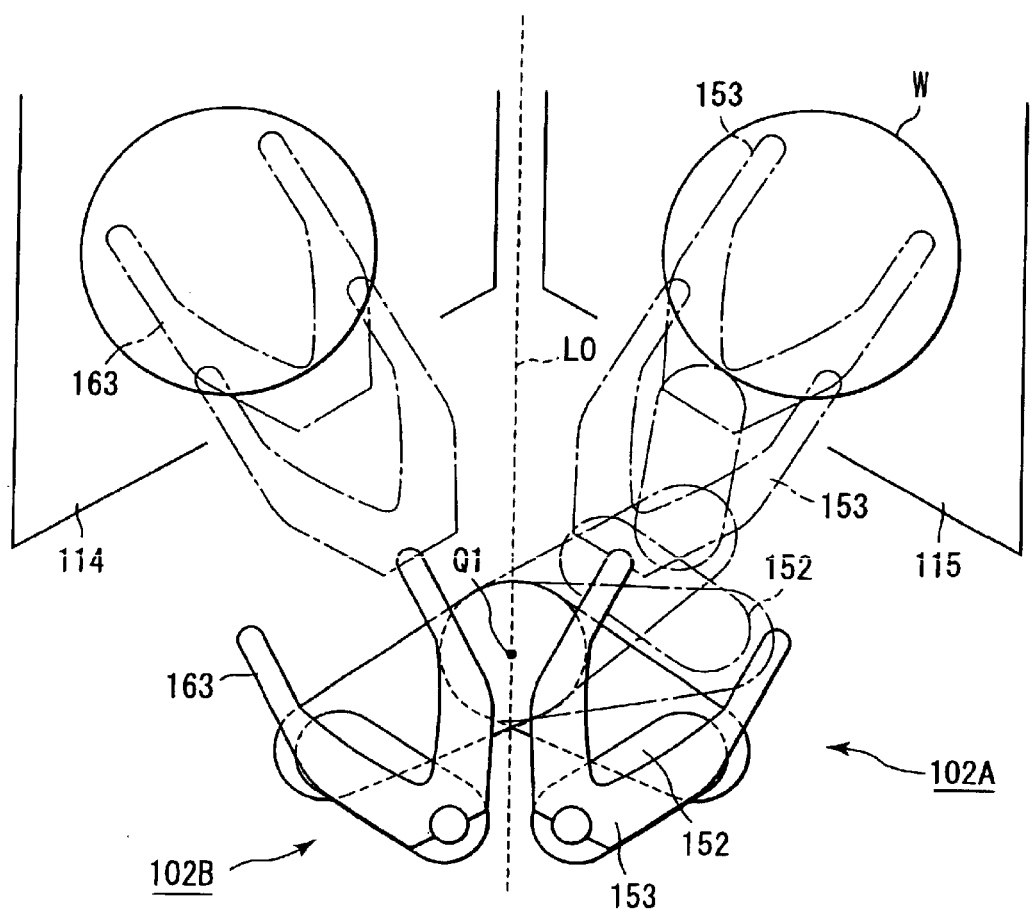
FIG. 9 is an explanatory diagram showing the operation of the substrate transfer device.

Here, from the fact that the ratio of the number of teeth between base-end pulley 172 and support pulley 173 is 2.67:1, when swivel arm 151 rotates by $\alpha$ degrees from its standard position, middle arm 152 rotates by $-2.67\alpha$ degrees. And when middle arm 152 rotates clockwise, intermediate pulley 176 rotates counter-clockwise relative to middle arm 152, so substrate holding arm 153 rotates counterclockwise, and because the ratio of the number of teeth between intermediate pulley 176 and tip-end pulley 177 is 1:2, substrate holding arm 153 rotates by $1.335\alpha$ degrees. Therefore, as shown in FIG. 9, when first multi-joint arm 102A is extended from its standard position and substrate holding arm 153 is caused to advance, the locus of motion of substrate holding arm 153, or more particularly of the center position of wafer W held in substrate holding arm 153, describes a curve in a direction away from horizontal straight line L0. Straight line L0 is a horizontal straight line that joins points equidistant from first and second substrate holding arms 153 and 163 in the standard position and passes through swivel center Q1. In second multi-joint arm 102B as well, when stopped with regard to second swivel drive part 164 (see FIG. 7) and operated with regard to second telescoping drive part 165, which is the drive part of rotation shaft 181, the same motion is made, and the locus of motion of substrate holding arm 163 becomes symmetrical to the locus of motion of substrate holding arm 153 with respect to straight line L0.

Next we explain, among the operation modes of substrate transfer device 102, the swivel mode. In this swivel mode, with regard to first multi-joint arm 102A, in the state in standard position, first swivel drive part 154 and first telescoping drive part 155 are simultaneously operated, rotating base-end pulley 172 and swivel shaft 170 counterclockwise, and with regard to second multi-joint arm 102B, in the state in standard position, second swivel drive part 164 and second telescoping drive part 165 are simultaneously operated, rotating base-end pulley 182 and swivel shaft 180 counterclockwise. Because of this, first and second multi-joint arms 102A and 102B rotate counter-clockwise about swivel center Q1, while keeping the state in standard position shown by the solid lines in FIG. 4.

Further, we explain, among the operation modes of substrate transfer device 102, the telescoping/swivel mode. In this mode, with respect to first and second multi-joint arms 102A and 102B in standard position, first and second telescoping drive parts 155 and 165 are driven without driving first and second swivel drive parts 154 and 164 as in the aforementioned telescoping mode, and because of this, first and second substrate holding arms 153 and 163 advance, describing a curve so that they open up left and right symmetrically with respect to straight line L0.

Figure 10:
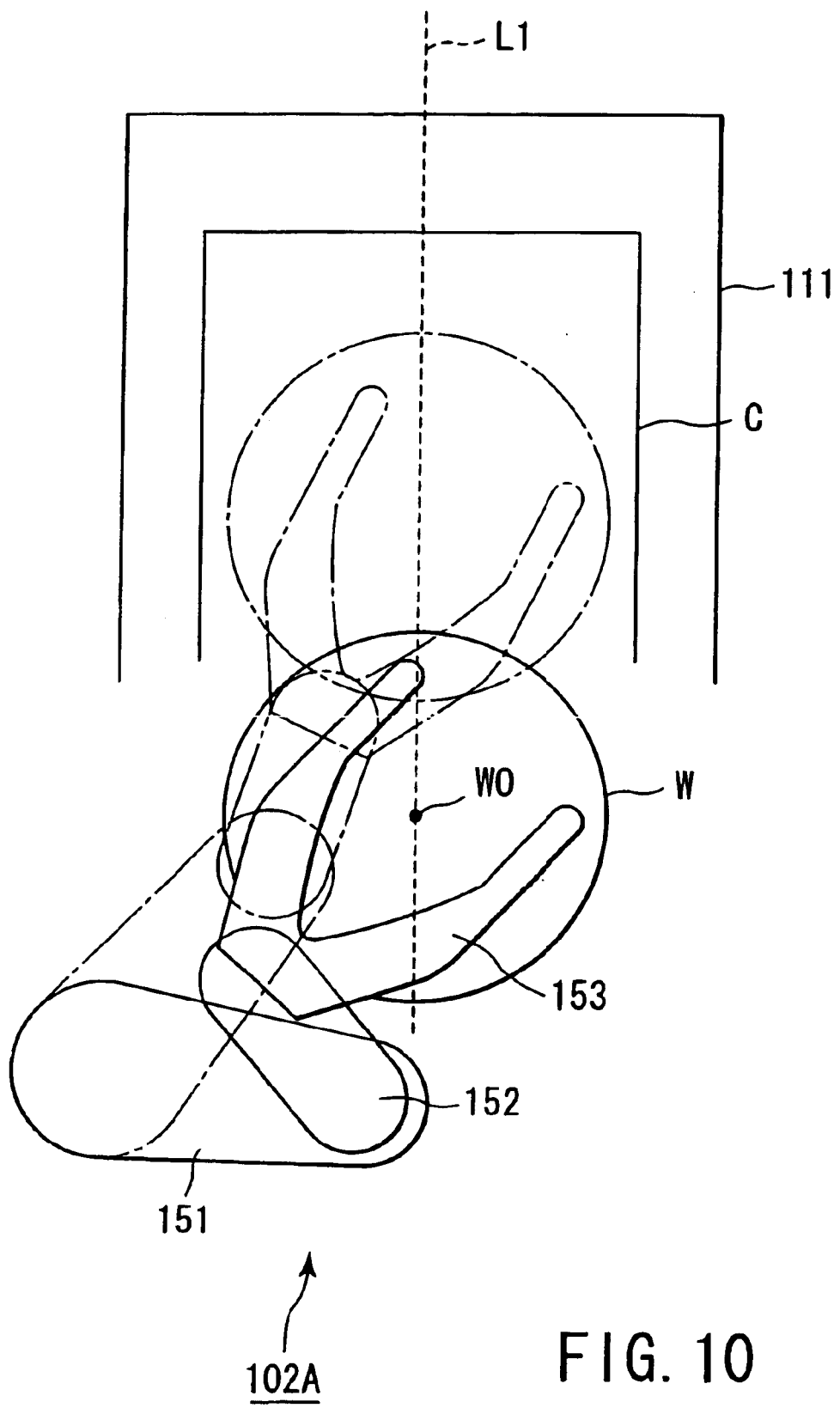
FIG. 10 is an explanatory diagram showing the operation of the substrate transfer device.

And to give an explanation concerning first substrate holding arm 153, when it reaches a prescribed position, in this example, a position facing cassette C, as is shown in greater detail by the solid lines in FIG. 10, when it reaches a location such that center W0 of wafer W held in substrate holding arm 153 is positioned on the extension of horizontal centerline L1 of cassette C, first swivel drive part 154 is driven so that swivel shaft 170 rotates counterclockwise. As a result, as shown in FIG. 10, first substrate holding arm 153, while advancing, moves linearly from its solid-line position to its dotted-line position in FIG. 10, by a combination of the operation of trying to bend to the left and the operation of trying to rotate inward (toward straight line L0). That is, the locus of motion of center W0 of wafer W becomes a straight line.

With regard to second substrate holding arm 163 too, a symmetrical operation is performed in exactly the same way. When second substrate holding arm 163 reaches a position facing cassette C, that is, when it reaches a location such that center W0 of wafer W held in substrate holding arm 163 is positioned on the extension of horizontal centerline L1 of cassette C, second swivel drive part 164 is driven so that swivel shaft 180 rotates clockwise. As a result, second substrate holding arm 163, while advancing, moves linearly, by a combination of the operation of trying to bend to the left and the operation of trying to rotate inward (toward straight line L0).

Because first substrate transfer device 102 operates as described above, in operating the substrate processing device, transfer takes place for example as follows. Referring to FIG. 4, pre-processing wafer W is held by cassette C and is transferred into cassette chamber 111 or 112, gate door GD is closed to form an airtight space, then, for example, an inert-gas atmosphere is made. Then gate valves G on the inner side of cassette chambers 111 and 112 open, and first and second multi-joint arms 102A and 102B inside first transfer chamber 113, which has been given an inert-gas atmosphere, carry out the aforesaid telescoping/swivel mode operation. In this mode, first and second substrate holding arms 153 and 163 advance describing a curve while mutually opening up, and when they reach a position facing cassettes C in cassette chambers 111 and 112, they advance into cassettes C moving in a straight line, cassettes C are lowered by elevator mechanism 111b shown in FIG. 5, and wafers W are passed to first and second substrate holding arms 153 and 163.

Figure 11:
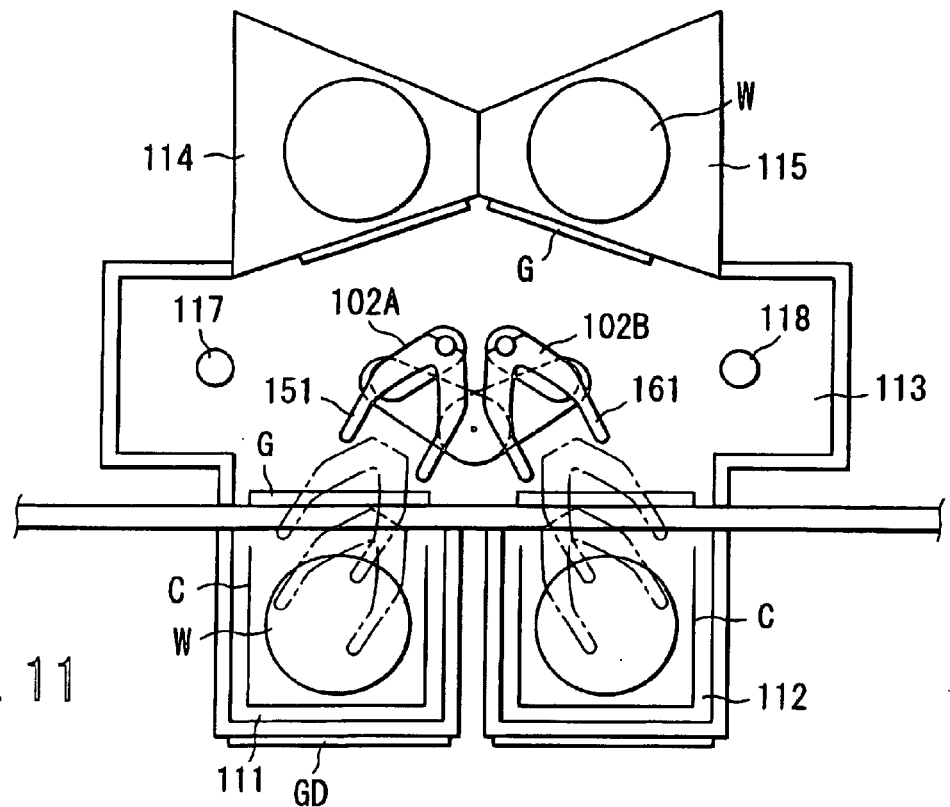
FIG. 11 is an explanatory diagram showing how wafers are transferred in the substrate processing device.

Next, first and second substrate holding arms 153 and 163 retract as far as the standard position shown by the solid lines in FIG. 11, along the loci they traversed when advancing in. Then, for positioning of wafers W, wafers W on first and second substrate holding arms 153 and 163 are passed in sequence to positioning stages 117 and 118. That is, by driving first and second swivel drive parts 154 and 164, first and second swivel arms 151 and 161 are simultaneously swiveled by the prescribed angle; by driving first telescoping drive part 155, first substrate holding arm 153 is extended and wafer W is passed onto positioning stage 117; and after positioning takes place here, first substrate holding arm 153 is retracted, following which first and second swivel arms 151 and 161 are simultaneously swiveled by the prescribed angle; and likewise for the wafer W on second substrate holding arm 163, positioning takes place in the same way by positioning stage 118. Next, by swivel mode, first and second swivel arms 151 and 161 are simultaneously swiveled, and first and second multi-joint arms 102A and 102B assume the attitude shown by the solid lines in FIG. 4. Thereafter, first and second multi-joint arms 102A and 102B perform the operations of telescoping mode, first and second substrate holding arms 153 and 163 advance describing a curve while mutually opening up, advance into preliminary vacuum chambers 114 and 115, respectively, and pass wafer W.

Then, after preliminary vacuum chambers 114 and 115 are given the prescribed vacuum atmosphere, wafers W in preliminary vacuum chambers 114 and 115 are simultaneously transferred by second substrate transfer device 103 into the prescribed mutually adjacent vacuum chambers 104, for example, vacuum chambers 104C and 104D, and the prescribed vacuum processing is carried out. On the other hand, wafers W on which vacuum processing has been completed are transferred out of vacuum chambers 104 by second substrate transfer device 103 and are transferred into preliminary vacuum chambers 114 and 115, respectively. These wafers W are passed to first and second multi-joint arms 102A and 102B and are returned into their original cassettes C.

By the above-described second embodiment, in telescoping mode, first and second substrate holding arms 153 and 163 advance describing a curve so that they mutually open up, so wafers W can be passed to first and second preliminary vacuum chambers 114 and 115, whose openings (transfer openings) face toward the swivel center. And in telescoping/swivel mode, first and second substrate holding arms 153 and 163 advance describing a curve so that they mutually open up, and it is arranged so that they can advance and retract along a straight line by combining the telescoping operation and the swivel operation from midway, allowing wafers W to be passed even if it is not the case that the two cassettes C are arranged side by side on a straight line and their openings face the swivel center.

Also, the length of middle arms 152 and 162 is made shorter than swivel arms 151 and 161, middle arms 152 and 162 are rotated rearward, substrate holding arms 151 and 161 are allowed to approach each other, and swiveling is done in this attitude, so the swivel radius is small, and because of this, the space for transfer chamber 113 can be made small, the transfer of wafers W can be done with high efficiency, and at the device's ports for transferring in and transferring out, for example two cassettes C can be arranged side by side along a straight line.

Figure 12:
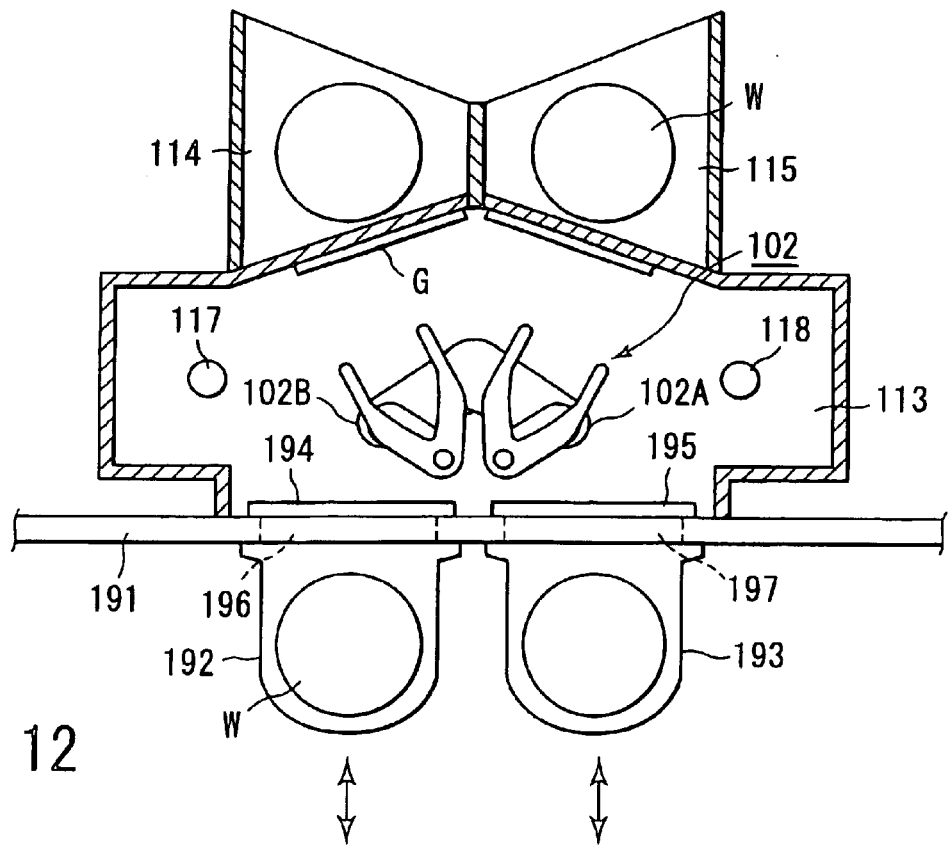
FIG. 12 is a plan view showing part of a substrate processing device according to a modification of the second embodiment.

In the above-described second embodiment, cassette chambers 111 and 112 are connected to first transfer chamber 113, but if the transfer containers are sealed cassettes, then, as shown in FIG. 12, a composition is adopted in which partition wall 191 is provided on one side of first transfer chamber 113; provided on the outside of this partition wall 191 are two placement platforms that can be advanced and retracted and form a placement area not seen in the drawing; sealed cassettes 192 and 193 are placed on these placement platforms and they are advanced; and the flange parts of cassettes 192 and 193 are made to attach firmly to the outer surface of partition wall 191. In this case too, cassettes 192 and 193 are arrayed side by side in a straight line. Transfer openings 196 and 197, which are opened and closed by doors 194 and 195, respectively, are formed side by side on partition wall 191; and doors 194 and 195 and the covers on the side of cassettes 192 and 193, respectively, are opened simultaneously, allowing the interior space of cassettes 192 and 193 to communicate with transfer chamber 113, following which passing is done by second transfer means 102 with respect to wafers W inside cassettes 192 and 193. Also, in this case, second transfer means 102 has a structure that can be raised and lowered by an elevator part not pictured.

In the above-described second embodiment, the structure is such that swivel shafts 170 and 180 of first multi-joint arm 102A and second multi-joint arm 102B cause driving independently of each other, but the two swivel shafts may be shared, that is, they may be driven by a common swivel drive part. In this case, for example, first multi-joint arm 102A is telescoped and passing of a substrate is done, following which second multi-joint arm 102B is telescoped and passing of a substrate is done. Also, the substrate transfer device of the second embodiment may be made in such a way that first telescoping drive part 154 and second telescoping drive part 164 are in common, and first multi-joint arm 102A and second multi-joint arm 102B are driven by a single shaft. Moreover, four or more arms may be used instead of the three arms used in the first and second multi-joint arms used in the second embodiment.

This second embodiment can also be applied to the case in which no preliminary vacuum chamber (load lock chamber) is connected to first transfer chamber 113 in which first and second multi-joint arms 102A and 102B are arranged, but a substrate process chamber in which vacuum processing is done is attached. Also, the substrate process chambers are not limited to one-wafer-at-a-time vacuum process chambers; it may also be a partitioned space that includes, for example, an upright batch furnace for heat processing in batches and a loading area with, for example, an inert-gas atmosphere for transferring substrates into this batch furnace.

With the substrate transfer device of the second embodiment, in some of the operation modes the driving of the swivel drive parts and the driving of the telescoping drive parts is done simultaneously, so the degree of freedom of the design of the transfer paths is high. And by adding a mode in which only the telescoping drive parts are driven and the first and second substrate holding arms move describing a curve while opening up to the left and right with respect to a horizontal straight line that passes through the swivel center, even if the openings (transfer openings) of two mutually adjacent chambers do not face toward the swivel center, passing of substrates can be done with respect to these chambers, and transferring can be done efficiently. Moreover, by driving also swivel drive parts in addition to telescoping drive parts, the substrate holding arms are made to execute linear motion, so substrate passing can be done also in the case in which the first and second substrate transfer containers are aligned left and right on a straight line (in a horizontal row). Also with the substrate processing device of the second embodiment, by employing the substrate transfer device, it is possible to arrange first and second substrate transfer containers left and right on a straight line and to perform high-throughput processing.

[Third Embodiment]

Figure 13:
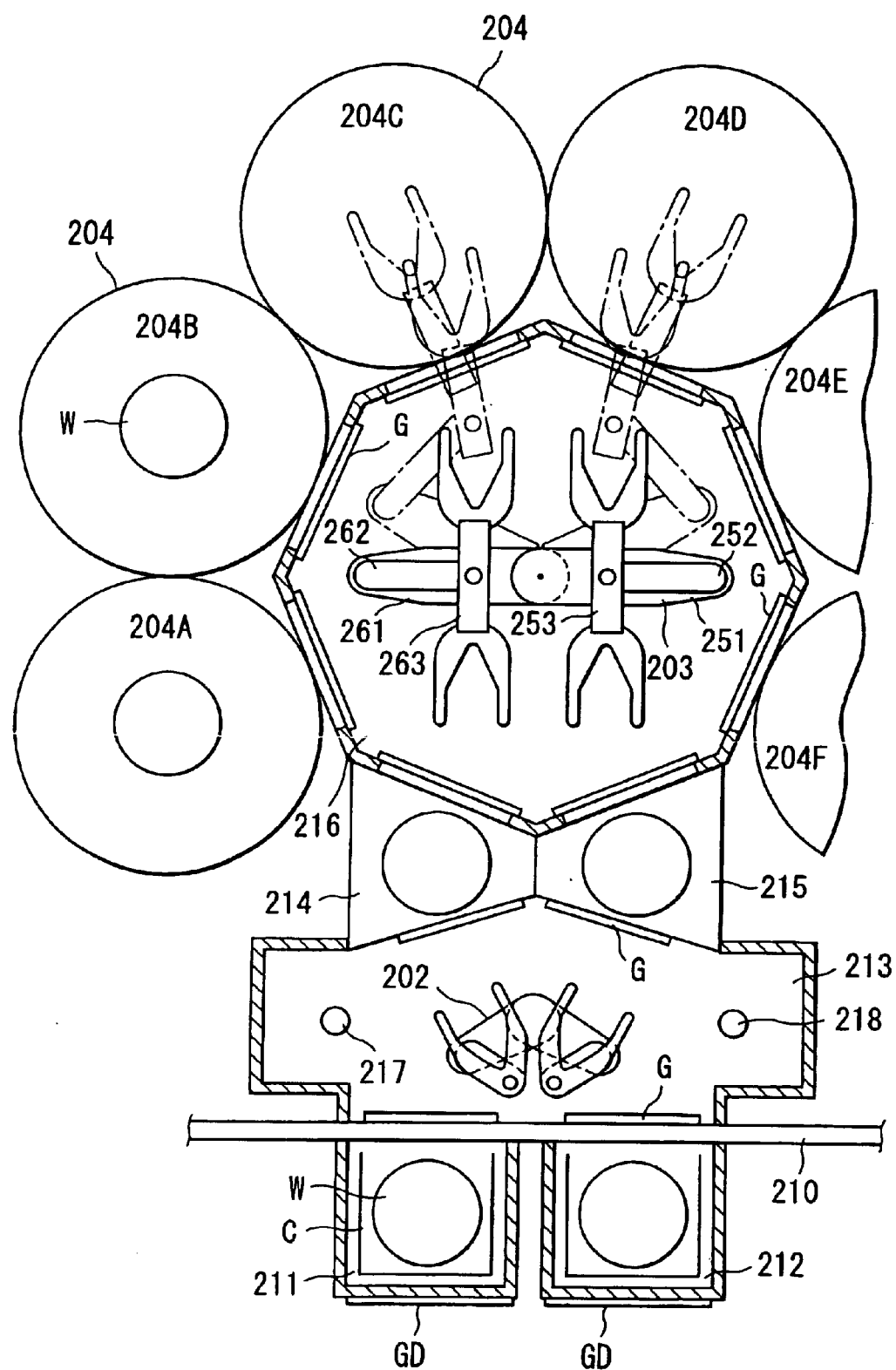
FIG. 13 is an overall plan view of a substrate processing device according to a third embodiment of present invention.
Figure 14:
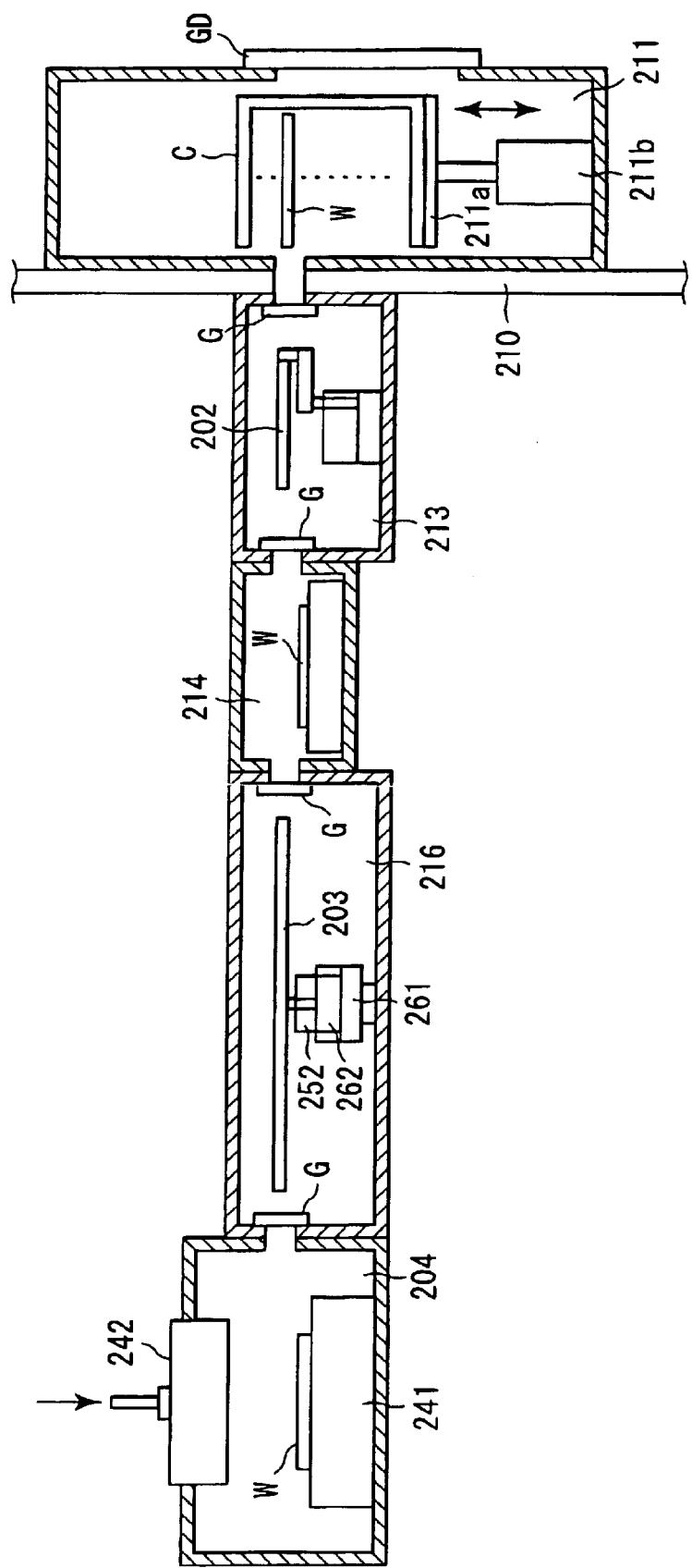
FIG. 14 is a schematic vertical cross-sectional view showing a sketch of the substrate processing device.

FIGS. 13 and 14 show a substrate processing device according to a third embodiment of present invention. This substrate processing device has, for example, two cassette chambers 211 and 212 of airtight structure, into which are transferred cassettes (transfer containers) C, which store multiple wafers, which are the substrates. Cassette chambers 211 and 212 each have a gate door GD on the atmosphere side, and the space with the atmosphere is airtightly partitioned by this gate door GD. Provided inside cassette chambers 211 and 212, as shown in FIG. 14, is elevator part 211b for raising and lowering cassette placement platform 211a and successively positioning the wafer retention grooves inside cassette C to the access level of the first transfer device, which is discussed below.

First transfer chamber 213, which is of airtight structure, is airtightly connected to the interior side of cassette chambers 211 and 212, and second transfer chamber 216, which is given a vacuum atmosphere, is airtightly connected to this first transfer chamber 213, via preliminary vacuum chambers 214 and 215, which are two load lock chambers (standby chambers) aligned to the left and right. Also, 210 in the diagram is a panel that constitutes the wall surface part. Provided inside first transfer chamber 213 are positioning stages 217 and 218 for rotating wafers W and aligning their orientation, and first substrate transfer device 202 for transferring wafers W between cassette chamber 211 and 212 and preliminary vacuum chambers 214 and 215 and positioning stages 217 and 218. Cassette chambers 211 and 212 and first transfer chamber 213 are given an atmosphere of, for example, inert gas, but may also be given a vacuum atmosphere.

Second transfer chamber 216 is formed in a polygonal shape, for example an octagonal shape, and provided inside it is second substrate transfer device 203. Connected airtightly to six of the sides of the octagon of this second transfer chamber 216 are vacuum chambers 204 (204A–204F), which are substrate process chambers, and connected to the remaining two sides are preliminary vacuum chambers 214 and 215. In FIG. 13, vacuum chambers 204 are pictured, for convenience in illustration, as simple circles, but if circular chambers are actually used, a member that joins the chamber and second transfer chamber 216 and forms a transfer opening is interposed between them.

Vacuum chambers 204 may also be chambers in the shape of, for example, a quadrilateral. What can be cited as the vacuum processing that is done in vacuum chambers 204 includes, for example, etching by etching gas, film formation processing by film formation gas, and ashing by ashing gas. Provided inside a vacuum chamber 204, as shown in FIG. 14, are placement platform 241 onto which to place wafer W and gas supply part 242 for supplying processing gas, and the centers of the wafers W placed onto placement platforms 241 in vacuum chambers 204 lie on a circle whose center is the center of second transfer chamber 216.

Figure 15:
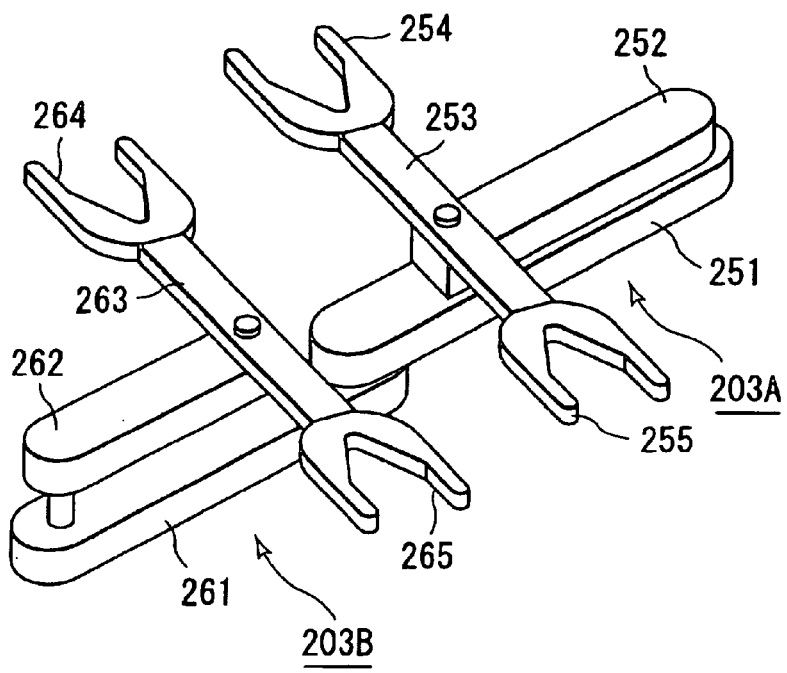
FIG. 15 is a schematic view showing a substrate transfer device according to the third embodiment of the present invention.
Figure 16:
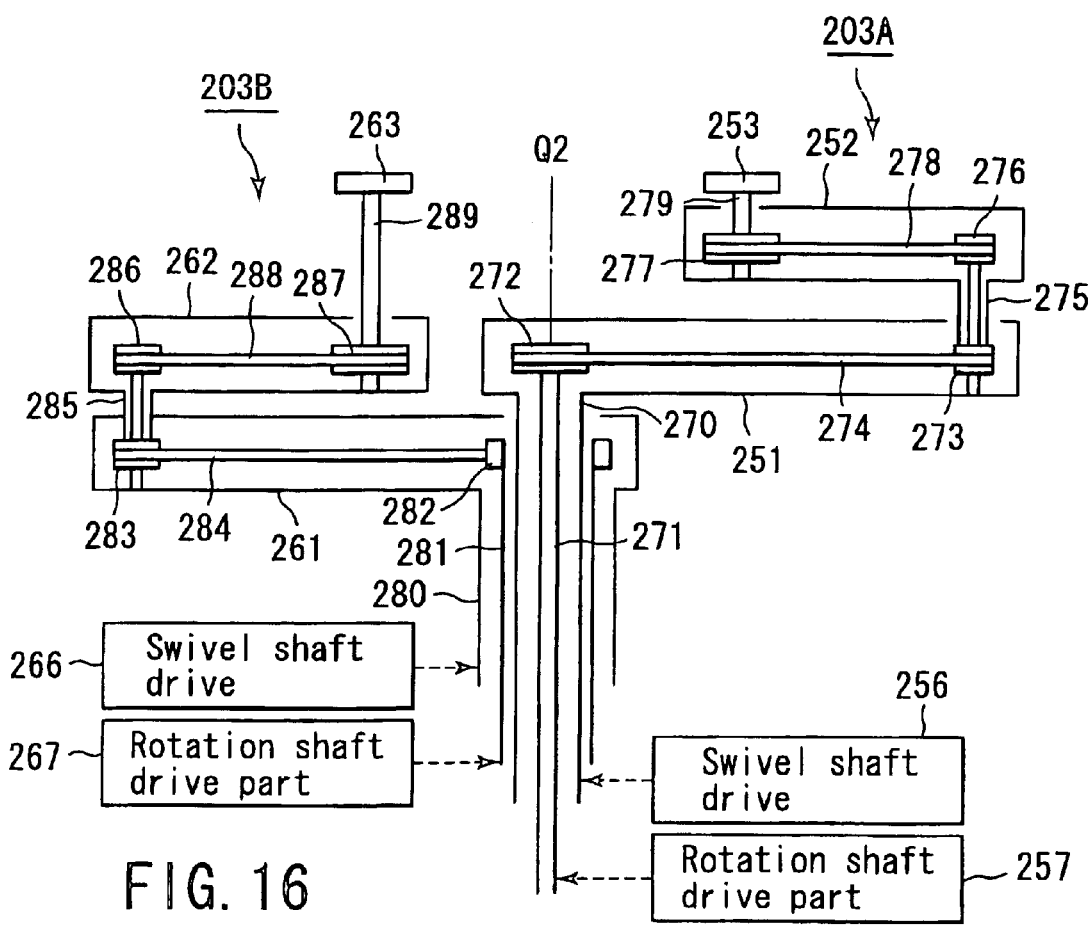
FIG. 16 is an explanatory diagram showing the transmission system of the substrate transfer device.

Next, we describe in detail second substrate transfer device 203, which is a substrate transfer device according to the third embodiment of the present invention. FIGS. 15 and 16 show a general view and the transmission system, respectively, of second substrate transfer device 203. In this example, this substrate transfer device 203 has first multi-joint arm 203A, which forms the first transfer part, and second multi-joint arm 203B, which forms the second transfer part, and first multi-joint arm 203A has swivel arm 251, which comprises the first swivel part, whose swivel center is the center of second transfer chamber 216, middle arm 252, which is provided rotatably in the horizontal direction at the tip-end part of this swivel arm 251, and substrate holding arm 253, which comprises the first substrate holding part provided rotatably in the horizontal direction at the tip-end part of this middle arm 252. Middle arm 252 is made shorter than swivel arm 251; for example, it is set to 1/1.65 the length of swivel arm 251.

Second multi-joint arm 203B, whose swivel center coincides with swivel center Q1 of said swivel arm 251, has swivel arm 261, which is provided below swivel arm 251 and comprises the second swivel part, middle arm 262, which is provided on this swivel arm 261, and substrate holding arm 263, which comprises the second substrate holding part provided on this middle arm 262. The structure of second multi-joint arm 203B is essentially the same as the structure of first multi-joint arm 203A, but it is different in, for example, the length of the rotation shaft of substrate holding arm 263, in order to ensure that the height position of substrate holding arm 263 is made the same as substrate holding arm 253 of first multi-joint arm 203A, that is, in order to ensure that the composition is such that substrate holding arms 253 and 263 transfer on the same plane.

First multi-joint arm 203A and second multi-joint arm 203B are set so that, in their standard position, swivel arms 251 and 261 lie on a straight line and middle arms 252 and 262 overlay swivel arms 251 and 261, respectively, and lie on a straight line. And they are set so that at this time substrate holding arms 253 and 263 are perpendicular to middle arms 252 and 262, respectively. Substrate holding arm 253 (263) is shaft-supported on middle arm 252 (262) in the exact middle of its length direction, and fork-shaped holding parts 254 and 255 (264 and 265) for holding wafers W are provided at both ends in the advance-retract direction so that they can hold two substrates each.

Describing the transmission system of first and second multi-joint arms 203A and 203B while referring to FIG. 16, the composition is such that swivel arm 251 of first multi-joint arm 203A swivels by cylindrical swivel shaft 270, whose center of rotation is swivel center Q1. Provided on the base-end side of swivel arm 251 is base-end pulley 272, which can rotate independently of swivel arm 251 by rotation shaft 271, whose center of rotation is swivel center Q1 and which is provided inside cylindrical swivel shaft 270. Provided rotatably on the tip-end part of swivel arm 251 is support pulley 273, which supports middle arm 252 and rotates integrally with middle arm 252, and this support pulley 273 is coupled to base-end pulley 272 by timing belt 274.

Affixed to the upper-end part of hollow rotation shaft 275, which is provided on the upper side of support pulley 273, is middle arm 252. Provided on the base-end part of middle arm 252, coaxially with said support pulley 273, is intermediate pulley 276, which for example is of the same diameter and has the same number of teeth as said support pulley 273, while provided rotatably on the tip-end part of middle arm 252 is tip-end pulley 277, and this tip-end pulley 277 is coupled to intermediate pulley 276 by timing belt 278. Intermediate pulley 276 is affixed to shaft part 276a, which passes through the interior of hollow rotation shaft 275 and is affixed to swivel arm 251. Affixed to the upper-end part of rotation shaft 279, which is provided on the upper side of tip-end pulley 277, is substrate holding arm 253.

In a usual multi-joint arm, the substrate holding arm executes linear motion, by setting the ratio of the number of teeth between base-end pulley 272 and support pulley 273 to 2:1 and setting the ratio of the number of teeth between intermediate pulley 276 and tip-end pulley 277 to 1:2, but in multi-joint arm 203A of this third embodiment the ratio of the number of teeth between base-end pulley 272 and support pulley 273 is set to, for example, 2.67:1, which is a value greater than 2, and the ratio of the number of teeth between intermediate pulley 276 and tip-end pulley 277 is set to 1:2. Because of this, substrate holding arm 253 assumes a locus that describes a curve, as discussed below.

In second multi-joint arm 203B, 280 is a cylindrical swivel shaft, 281 is a cylindrical rotation shaft, 282 is a base-end pulley, 283 is a support pulley, 284 is a timing belt, 285 is a rotation shaft, 286 is an intermediate pulley, 286a is a shaft part, 287 is a tip-end pulley, 288 is a timing belt, and 289 is a rotation shaft. Second multi-joint arm 203B is different from first multi-joint arm 203A in several points—for example, rotation shaft 281 of base-end pulley 282 is provided so as to surround swivel shaft 270 of first multi-joint arm 203A, and rotation shaft 289 of substrate holding arm 263 is longer than rotation shaft 279 of substrate holding arm 253 of first multi-joint arm 203A—but it is exactly the same as first multi-joint arm 203A in its composition that determines the transfer function. Therefore, the center of rotation of swivel shaft 280 and rotation shaft 281 is said swivel center Q1, middle arm 262 is set to 1/1.65 the length of swivel arm 261, the ratio of the number of teeth between base-end pulley 282 and support pulley 283 is set to 2.67:1, and the ratio of the number of teeth between intermediate pulley 286 and tip-end pulley 287 is set to 1:2.

In FIG. 16, 256 and 257 are, respectively, the drive part of swivel shaft 270 and the drive part of rotation shaft 271 in first multi-joint arm 203A, and 266 and 267 are, respectively, the drive part of swivel shaft 280 and the drive part of rotation shaft 281 in second multi-joint arm 203B. These drive parts 256, 257, 266, and 267 correspond to mechanisms made up of motors, pulleys, and belts, etc. Rotation shaft drive part 257 and the aforementioned base-end pulley 272 and the other pulleys, timing belts, and rotation shafts, etc. correspond to a first advance-retract drive part for advancing and retracting the substrate holding part of first multi-joint arm 203A, and rotation shaft drive part 267 and the aforementioned base-end pulley 282 and the other pulleys, timing belts, and rotation shafts, etc. correspond to a second advance-retract drive part for advancing and retracting the substrate holding part of second multi-joint arm 203B.

Figure 17:
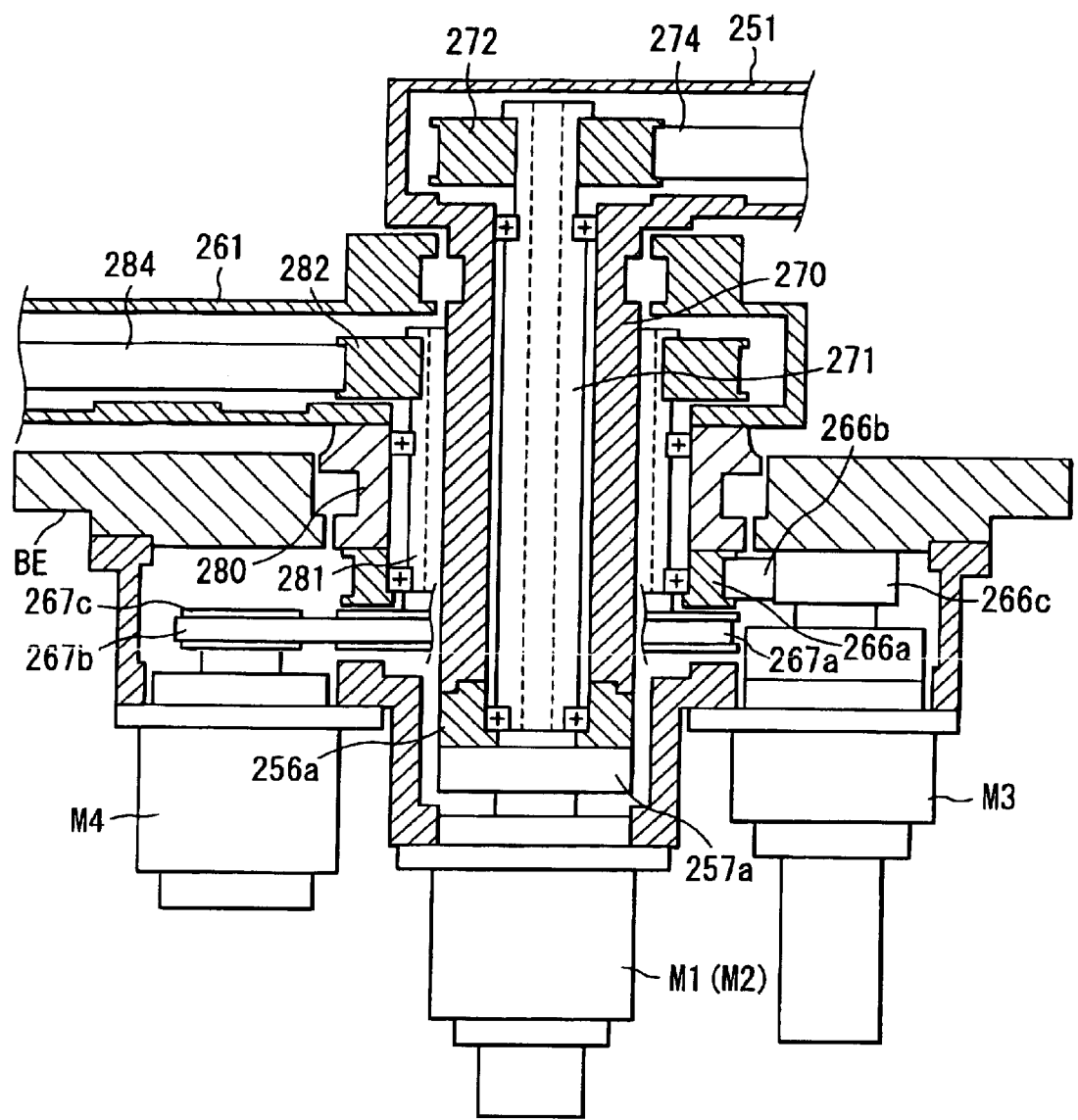
FIG. 17 is a cross-sectional view showing an example of the specific composition of part of the substrate transfer device.

FIG. 17 shows an example of the specific structure of swivel shafts 270 and 280 and rotation shafts 271 and 281 in first and second multi-joint arms 203A and 203B and related parts. In FIG. 17, 256*a* and 257*a* are pulleys for rotating swivel shaft 270 and rotation shaft 271, respectively, and they are driven by, respectively, motor M1 and motor M2, which is hidden behind this motor M1 and cannot be seen. 266*a* is a pulley that rotates swivel shaft 280, and it is driven by motor M3 via drive pulley 266*c* and belt 266*b*. 267*a* is a pulley that rotates rotation shaft 281, and it is driven by motor M4 via drive pulley 267*c* and belt 267*b*. Motors M1–M4 are affixed to base BE, which forms the floor of transfer chamber 216.

Next, we describe the operation of the third embodiment. In first multi-joint arm 203A, when base-end pulley 272 is rotated, stopping with regard to drive part 256 of swivel shaft 270 (see FIG. 16) and operating with regard to drive part 257 of rotation shaft 271, rotation shaft 275, which supports middle arm 252, tries to rotate. At this time, no rotation force is given from drive part 256, and swivel shaft 270 is in a free state (rotatable state), so, as shown in FIG. 18, when base-end pulley 272 rotates clockwise, middle arm 252 tries to open up with respect to swivel arm 251, so it rotates clockwise, and swivel arm 251 also rotates, counterclockwise.

Figure 18:
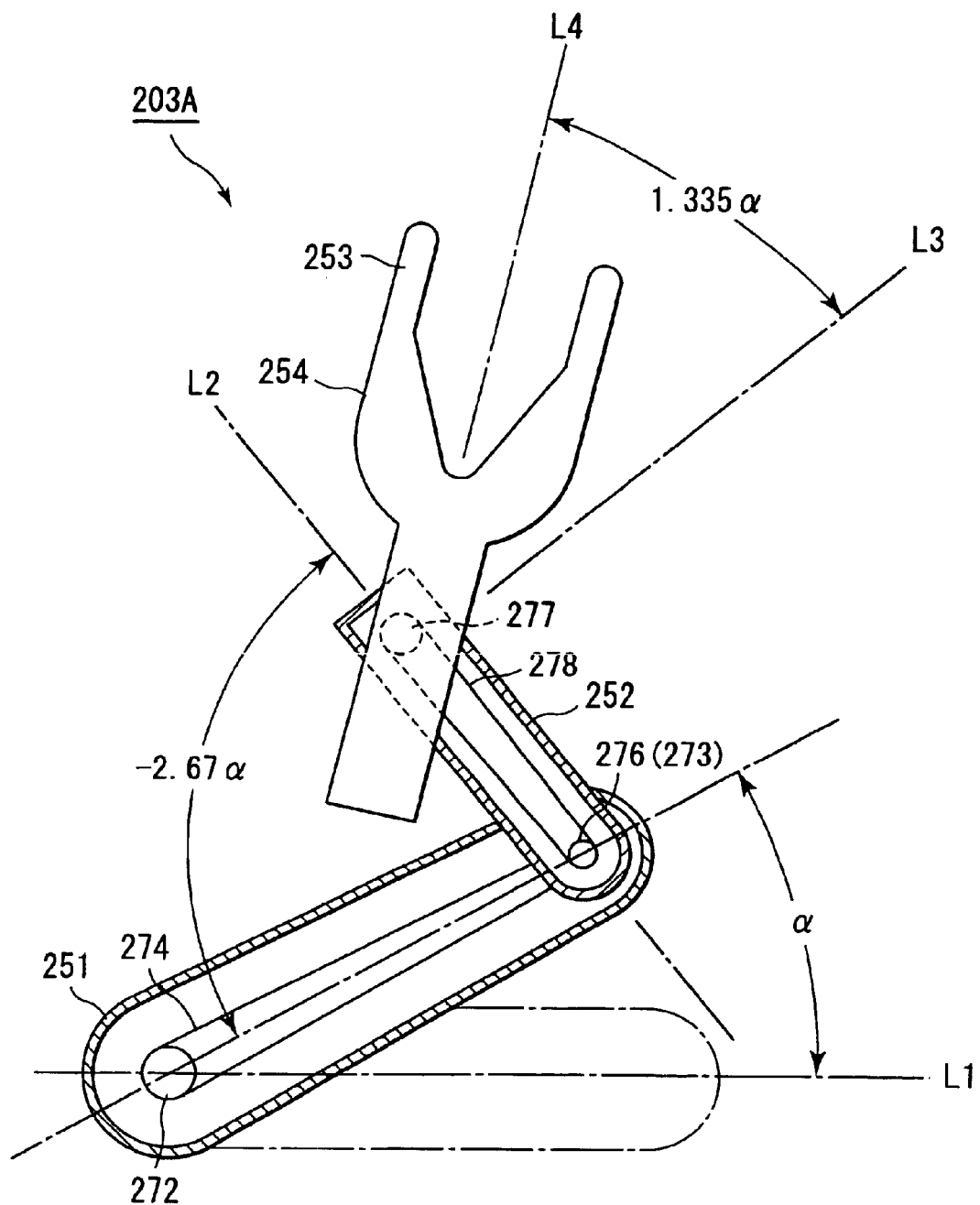
FIG. 18 is an explanatory diagram showing the principle of operation of the substrate transfer device.

Also, in FIG. 18, L1 is the shaft line of swivel arm 251 when first multi-joint arm 203A is in standard position (the line that joins the swivel center and the center of rotation of support pulley 273), L2 is the shaft line of middle arm 252 (the line that joins the center of intermediate pulley 276 and the center of tip-end pulley 277), L3 is the shaft line of substrate holding arm 253 when first multi-joint arm 203A is in standard position (the line that joins the center of tip-end pulley 277 and the center of wafer W when substrate holding arm 253 holds wafer W, the centerline of substrate holding arm 253 in its width direction), and L4 is the shaft line of substrate holding arm 253 when swivel arm 251 rotates by α degrees. Also, in FIG. 18, the other-side holding part 255 is omitted.

Figure 19:
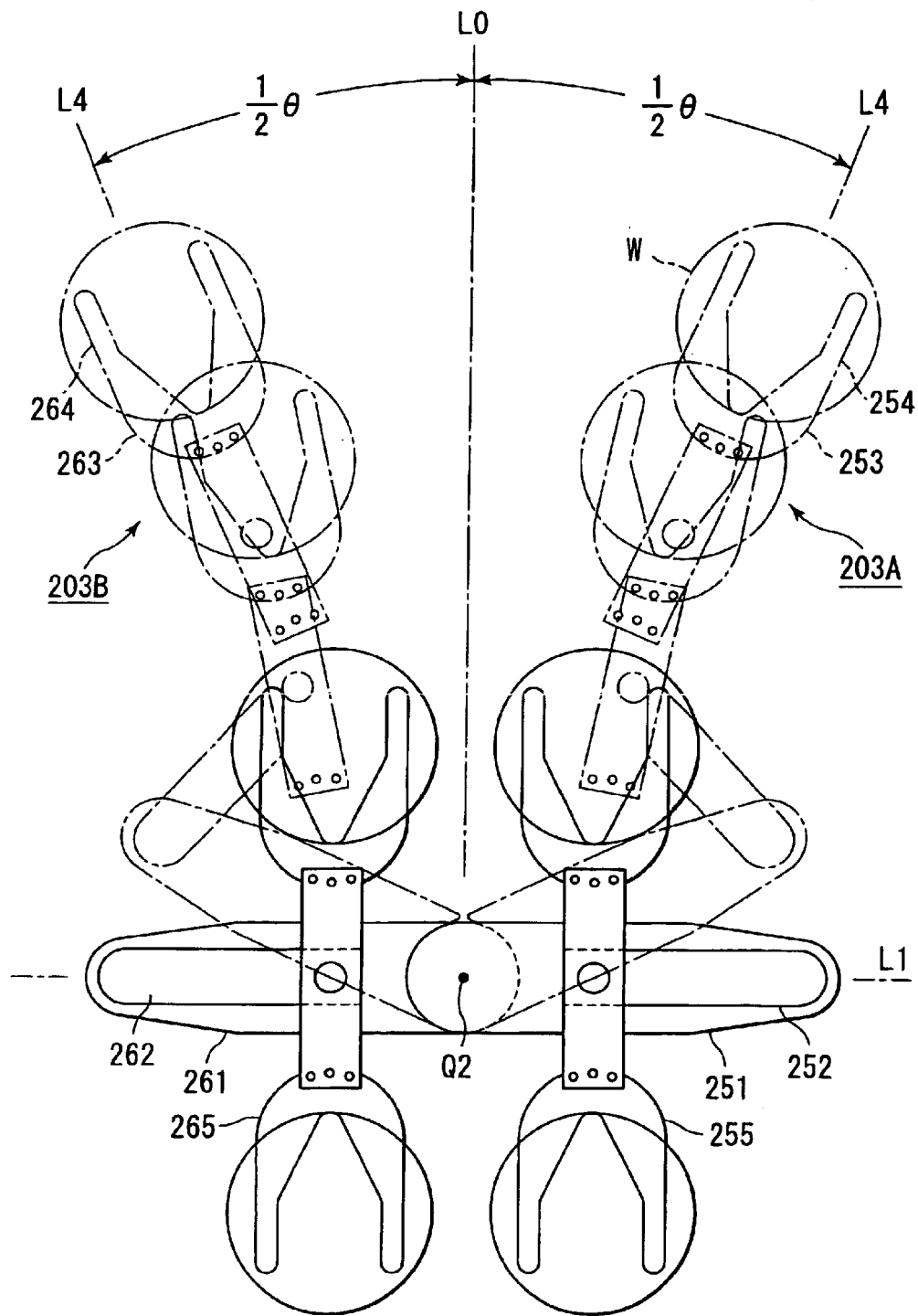
FIG. 19 is an explanatory diagram showing the operation of the substrate transfer device.

Here, from the fact that the ratio of the number of teeth between base-end pulley 272 and support pulley 273 is 2.67:1, when swivel arm 251 rotates by α degrees from its standard position, middle arm 252 rotates by −2.67α degrees. And when middle arm 252 rotates clockwise, intermediate pulley 276 rotates counter-clockwise relative to middle arm 252, so substrate holding arm 253 rotates counter-clockwise, and because the ratio of the number of teeth between intermediate pulley 276 and tip-end pulley 277 is 1:2, substrate holding arm 253 rotates by 1.335α degrees. Therefore, as shown in FIG. 19, when first multi-joint arm 203A is extended from its standard position and substrate holding arm 253 is caused to advance, the locus of substrate holding arm 253, or more particularly of the center position of wafer W held in substrate holding arm 253, passes through swivel center Q1 and describes a curve in a direction away from horizontal straight line L0, which is perpendicular to said straight line L1.

If made so that when the ratio of the number of teeth between base-end pulley 272 and support pulley 273 is A:1 and the ratio of the number of teeth between intermediate pulley 276 and tip-end pulley 277 is 1:2, shaft line L4 of substrate holding arm 253 when first multi-joint arm 203A is fully extended forms an angle of q/2 with respect to straight line L0, then we have the relationship A=360/(180−q). In this example, A is 2.67, so q is 45, and q/2 comes to 22.5. In second multi-joint arm 203B as well, the same motion is made, and the locus of motion of substrate holding arm 263 being symmetrical with the locus of motion of said substrate holding arm 253, shaft line L4 of substrate holding arm 263 when second multi-joint arm 203B is fully extended forms an angle of q/2 with respect to straight line L0, and in this example it comes to 22.5. In other words, if this substrate transfer device 203 simultaneously performs an extension operation on first multi-joint arm 203A and second multi-joint arm 203B, substrate holding arms 253 and 263, which are substrate holding parts (more particularly, holding parts 254 and 264) move symmetrically apart from each other while describing a curve, and the angle of opening (narrow angle) becomes the q that is expressed by A=360/(180−q), which in this case comes to 45 degrees.

The reason why the angle of opening has been set to 45 degrees is that, as shown in FIG. 13, second transfer chamber 216 is of octagonal shape, and in the opening of vacuum chambers 204 or preliminary vacuum chambers 214 and 215 connected to the side of transfer chamber 216, the emission angle from the center of transfer chamber 216 toward the centers of mutually adjacent openings (in other words, the angle formed by the centers of wafers W in mutually adjacent vacuum chambers 204 or preliminary vacuum chambers 214 and 215, with the center of transfer chamber 216) is 45 degrees. Also, in FIG. 19, even if base-end pulleys 272 and 282 are rotated in reverse (rotated counterclockwise), substrate holding arms 253 and 263 move in exactly the same way while describing loci that are symmetrical to the loci in the advancing direction.

And first and second multi-joint arms 203A and 203B rotate counterclockwise maintaining their state in the standard position shown by the solid lines in FIG. 13 if, for first multi-joint arm 203A, being in standard position, drive parts 256 and 257 are operated simultaneously, causing base-end pulley 272 and swivel shaft 270 to rotate counterclockwise, and for second multi-joint arm 203B, being in standard position, drive parts 266 and 267 are operated simultaneously, causing base-end pulley 282 and swivel shaft 280 to rotate counterclockwise.

Because second substrate transfer device 203 operates as described above, in operating the substrate processing device, transfer takes place for example as follows. Referring to FIG. 13, pre-processing wafer W is held by cassette C and is transferred into cassette chamber 211 or 212, gate door GD is closed to form an airtight space, then, for example, an inert-gas atmosphere is made. Then gate valves G on the inner side of cassette chambers 211 and 212 open, and wafers W are simultaneously removed by first substrate transfer device 202 inside first transfer chamber 213, which has been given an inert-gas atmosphere, from cassette C inside cassette chamber 211, and from cassette C inside cassette chamber 212, and are transferred to positioning stages 217 and 218. Moreover, first substrate transfer device 202 also consists of two multi-joint arms and is so constructed as to make it possible to transfer two wafers W simultaneously.

After the orientation of these two wafers W is aligned to the prescribed orientation, they are transferred to preliminary vacuum chambers 214 and 215 by first substrate transfer device 202, and after preliminary vacuum chambers 214 and 215 are set to the prescribed vacuum atmosphere, they are simultaneously transferred to the prescribed vacuum chambers 204 by second transfer device 203.

Figure 20A:
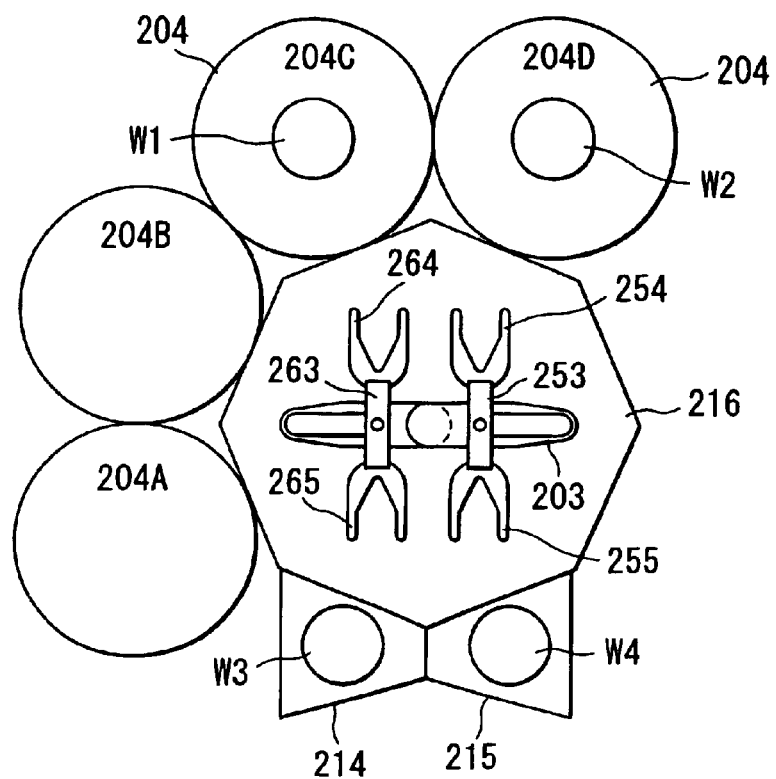
FIGS. 20A and 20B are explanatory diagrams showing how wafers are transferred in the substrate processing device.
Figure 20B:
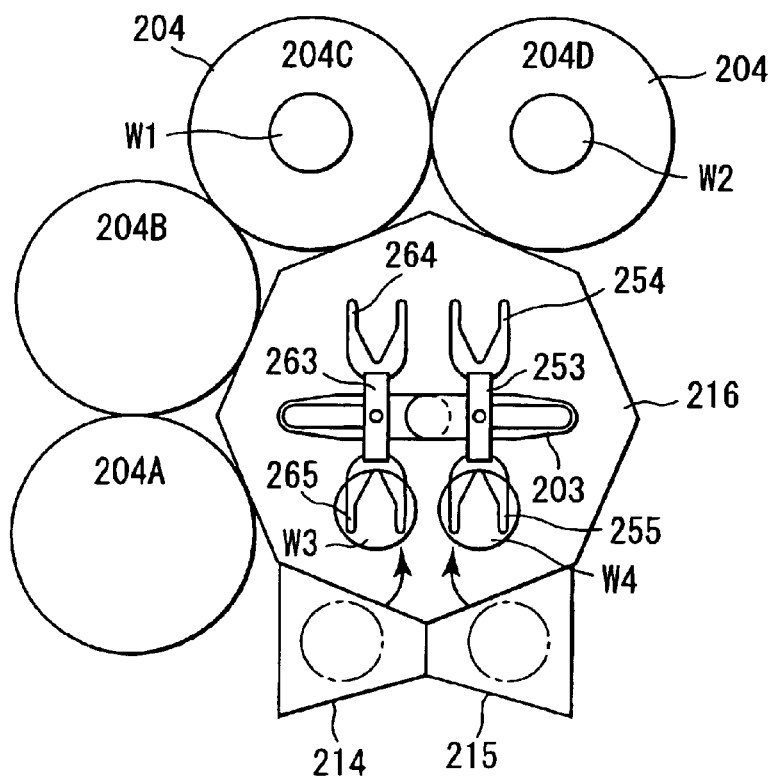
Figure 21A:
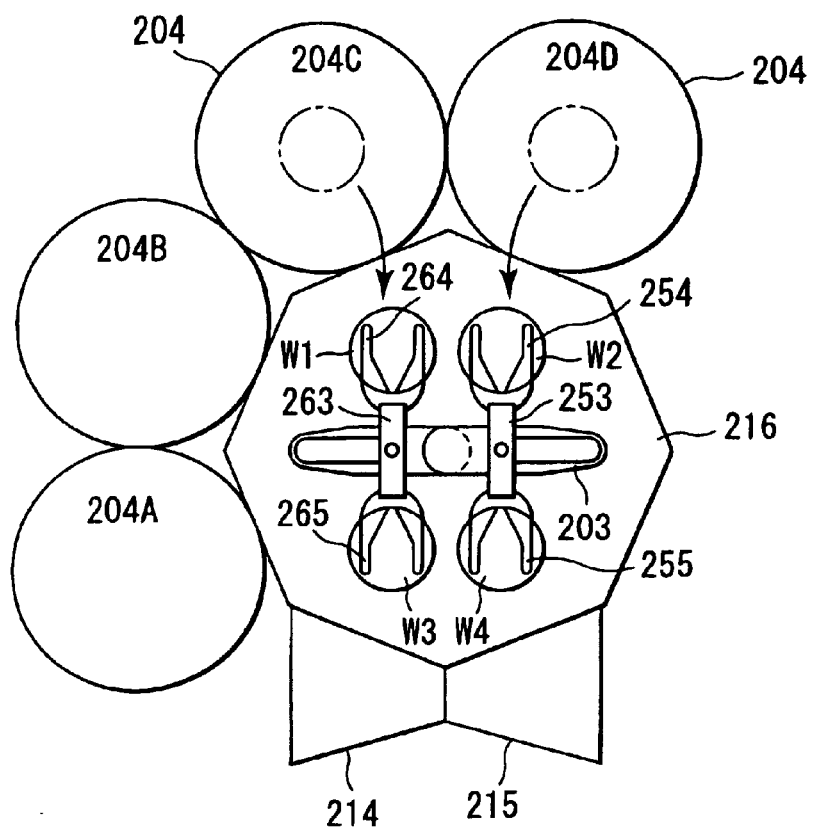
FIGS. 21A and 21B are explanatory diagrams showing how wafers are transferred in the substrate processing device.
Figure 21B:
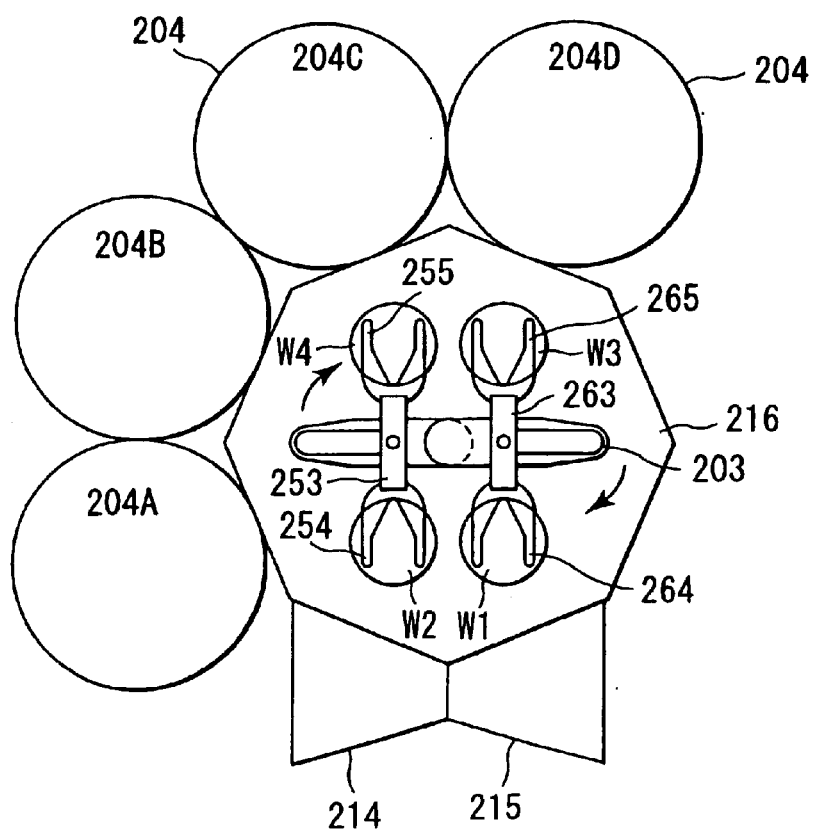
Figure 22A:
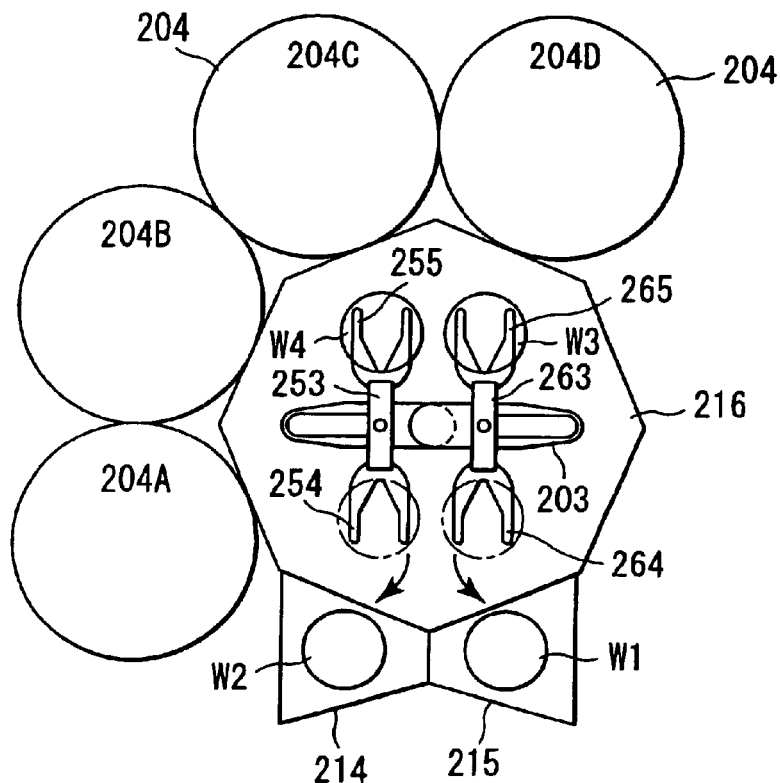
FIGS. 22A and 22B are explanatory diagrams showing how wafers are transferred in the substrate processing device.
Figure 22B:
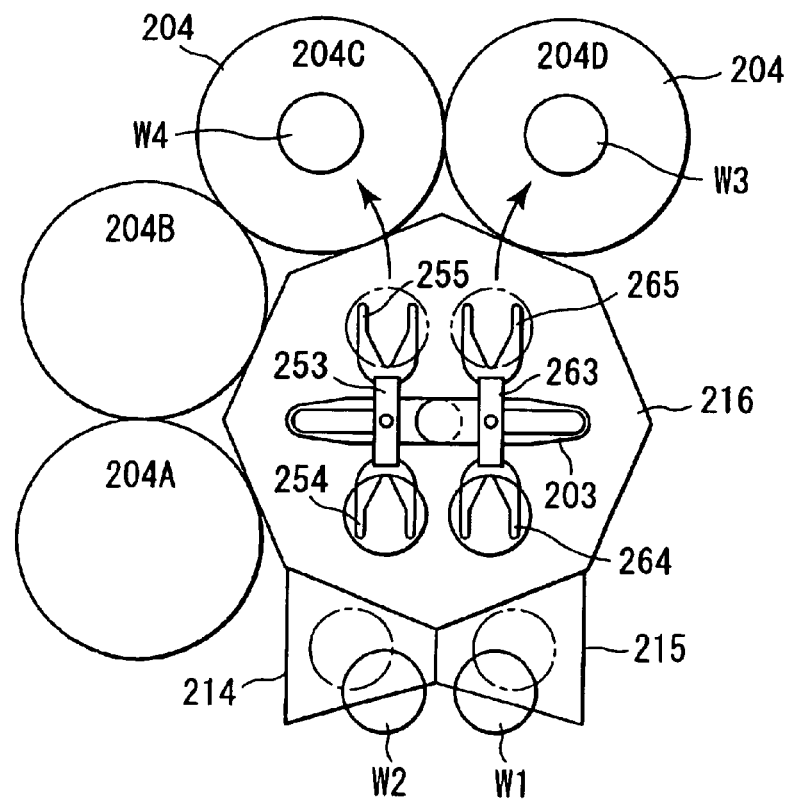

FIG. 20A depicts the state in which, for example, vacuum processing of wafers W1 and W2 is completed in vacuum chambers 204C and 204D, respectively, and wafers W3 and W4, which are to be processed next, are waiting in preliminary vacuum chambers 214 and 215. In this state, for example, substrate holding arms 253 and 263 of second substrate transfer device 203 intrude into preliminary vacuum chambers 214 and 215, respectively, and wafers W3 and W4 are received by holding parts 265 and 255, respectively (see FIG. 20B). Next, substrate holding arms 253 and 263 intrude into vacuum chambers 204C and 204D, respectively, and wafers W1 and W2 are received by holding parts 264 and 254, respectively (see FIG. 21A). Thereafter, as shown in FIG. 21B, second substrate transfer device 203 swivels by 180 degrees (more particularly, aforesaid swivel arms 251 and 261 swivel by 180 degrees), and as shown in FIG. 22A, wafers W1 and W2 held by substrate holding parts 264 and 254, respectively, are transferred to preliminary vacuum chambers 214 and 215, and as shown in FIG. 22B, wafers W3 and W4 held by substrate holding parts 265 and 255, respectively, are transferred into vacuum chambers 204C and 204D. Wafers W1 and W2 transferred into preliminary vacuum chambers 214 and 215, respectively, are for example simultaneously returned into cassette chamber 211 and 212 by first substrate transfer device 202. In the explanation thus far, we have focused on vacuum chambers 204C and 204D, but wafer replacement is done in the same way if vacuum processing of the wafers has been completed in, for example, vacuum chambers 204A and 204B.

And if, for example in FIG. 13, vacuum chambers 204A and 204F are not used, one may use the other four vacuum chambers 204B–204E that are lined up continuously, simultaneously transferring wafers W by substrate holding arms 253 and 263 with respect to pairs of vacuum chambers (204B, 204C) and (204D, 204E). In addition, because first multi-joint arm 203A and second multi-joint arm 203B can be driven independently, when for example vacuum chamber 204B is not used, transfer of wafers W can be done simultaneously by substrate holding arms 253 and 263 with respect to vacuum chambers (204C, 204D) and (204E, 204F), and with respect to vacuum chamber 204A, operation may be done using whichever mode is best: a mode in which both multi-joint arms 203A and 203B are driven, or a mode in which only one is driven, wherein one or the other of substrate holding arms 253 and 263 is used.

According to the above-described third embodiment, the loci of motion of substrate holding arm 253 of first multi-joint arm 203A (the first substrate holding part) and of substrate holding arm 263 of second multi-joint arm 203B (the second substrate holding part) are separate symmetrically respectively left and right from the horizontal straight line that passes through said swivel center, so passing of wafers W can be done without the two multi-joint arms 203A and 203B interfering with each other. And because it is possible to advance describing curves in such a way that substrate holding arms 253 and 263 mutually open up and to place substrate holding arms 253 and 263 in standard position and simultaneously swivel, it is possible for example to simultaneously pass wafers W with respect to any set of chambers among mutually adjacent vacuum chambers 204 provided on sides of octagonal second transfer chamber 216 or preliminary vacuum chambers 214 and 215, it is possible to perform operations with a high degree of freedom, and because a small swivel radius suffices, it is possible to transfer wafers W with high efficiency in a small transfer area.

In addition, because of the fact that first and second multi-joint arms 203A and 203B can be driven independently, by adding a mode in which only one of them is driven, it is possible to perform operations with an even higher degree of freedom; for example, even if several of the vacuum chambers 204 cannot be used, operations can be performed in which for example all of the remaining vacuum chambers 204 can be put to use. Moreover, because substrate holding arms 253 and 263, which are substrate holding parts, have holding parts (254, 255) and (264, 265) on both ends of each and can hold wafers W two at a time, as is clear from the above explanation of the operation, the frequency of swivel operations can be reduced, and in this respect too, transferring can be done with high efficiency.

And the footprint of the device (the area that it occupies) can be made small, because vacuum chambers 204 can be arranged along a circle whose center is the swivel center of substrate transfer device 203 inside second transfer chamber 216, and because second transfer chamber 216 can be made in polygonal shape.

In the third embodiment, the structure is such that the swivel shafts of first multi-joint arm 203A and second multi-joint arm 203B can be driven independently of each other, but both swivel shafts may share the same drive source. In this case the two swivel shafts are independent of each other, but they may have the same drive source in common, and the two swivel shafts may be shared in common. However, it sometimes happens that some error occurs in the layout when the device is put together, such as when vacuum chambers 204 are connected to transfer chamber 216, so if it is ensured that the swivel shafts can be driven independently of each another, said error can be absorbed by finely adjusting the position of the swivel shafts in the rotation direction, and thus it is preferable to have a composition that allows the swivel shafts to be driven independently of each other.

The third embodiment, in which all the chambers provided around the transfer chamber, which is equipped with a substrate transfer device, are substrate process chambers, can be applied to a device in which, for example, wafers are transferred into said transfer chamber from two of the substrate process chambers and wafers are transferred out from two other substrate process chambers. Also, the substrate process chambers are not limited to one-wafer-at-a-time vacuum process chambers; it may also be a partitioned space that includes, for example, an upright batch furnace for heat processing in batches and a loading area with, for example, an inert-gas atmosphere for transferring substrates into this batch furnace.

With the substrate transfer device of the third embodiment, passing of wafers W can be done without the two multi-joint arms 203A and 203B interfering with each other, and high-efficiency transfer can be done. Also, by having a composition whereby first and second substrate holding parts move describing curves while opening to the left and right with respect to a horizontal straight line that passes through the swivel center, even if the openings of two chambers are not in straight-line shape and face inward, substrate passing can be done by the first and second substrate holding parts with respect to these chambers, and transferring can be done efficiently within a small transfer area. Also, with the substrate processing device of the third embodiment, substrate process chambers can be arranged along a circle whose center is the swivel center of the substrate transfer device, and the transfer chamber can be made in polygonal shape, so the footprint of the device (the area that it occupies) can be made small, and moreover, efficient transferring can be done.

[Fourth Embodiment]

Figure 23:
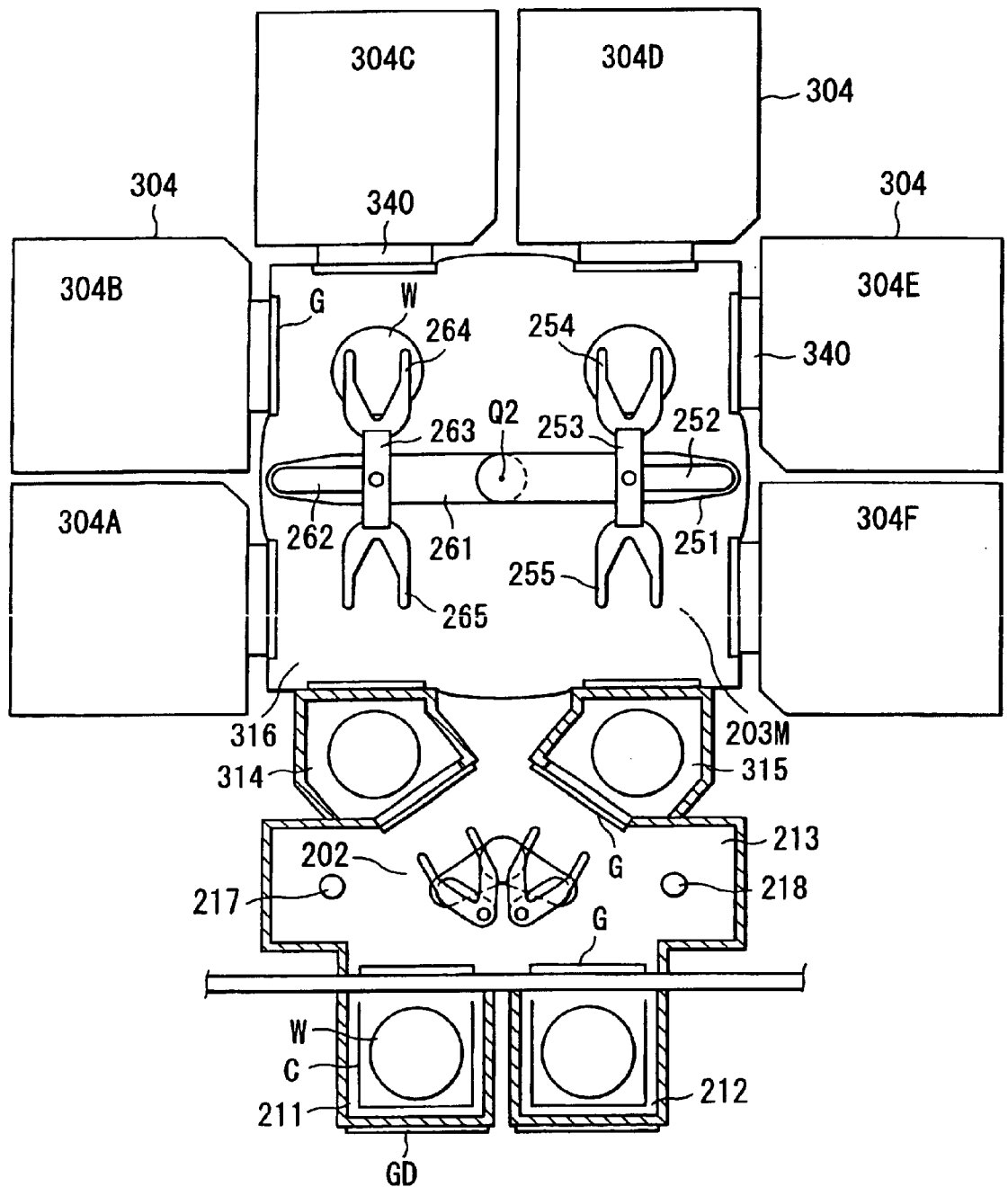
FIG. 23 is a view showing a substrate processing apparatus according to a fourth embodiment of the present invention.

FIG. 23 is a view showing a substrate processing apparatus according to a fourth embodiment of the present invention. The vertical cross-sectional view of this apparatus is substantially the same as that shown in FIG. 14 except for reference symbols of chambers.

The fourth embodiment employs a first transfer chamber 213 containing a first substrate transfer device 202, and cassette chambers 211 and 212, which are substantially the same as those employed in the substrate processing apparatus shown in FIG. 13 according to the third embodiment. On the other hand, it employs a second transfer chamber 316, which has, e.g., a rectangular shape, and provided with a second substrate transfer device 203M disposed therein. Two substrate process chambers or vacuum chambers 304 (304A, 304B), (304C, 304D), or (304E, 304F), each of which has a rectangular shape, are airtightly connected to each of three sides of the rectangular shape of the second transfer chamber 316. Two preliminary vacuum chambers 314 and 315 are connected to the other side of the second transfer chamber 316. A passage member 340 is disposed at the connecting portion between each vacuum chamber 304 and the second transfer chamber 316. Each passage member 340 is rectangular in the cross-section and forms a transfer port. In FIG. 23, G denotes a separation valve or gate valve.

What can be cited as the vacuum processing that is done in the vacuum chambers 304 includes, for example, etching by etching gas, film formation processing by film formation gas, and ashing by ashing gas. As shown in FIG. 14, provided in each vacuum chamber 304 are a worktable 241 to place a wafer W thereon, and a gas supply section 242 for supplying a process gas. The center of a wafer W placed on the worktable 241 in each vacuum chamber 304 lies on a circle whose center is the center of the second transfer chamber 316.

Next, a detailed explanation will be given of the second substrate transfer device 203M, which is a substrate transfer device according to the fourth embodiment of the present invention. The second substrate transfer device 203M is substantially the same as the substrate transfer device 203 according to the third embodiment explained with reference to FIGS. 13 to 22B, except for the ratio in length between a swivel arm 251 and a middle arm 252 in each of first and second multi-joint arms 203A and 203B. Accordingly, the appearance, transmission system, and drive shaft part of the substrate transfer device 203M according to the fourth embodiment are arranged as shown in FIGS. 15, 16, and 17, respectively.

In the substrate transfer device 203M according to the fourth embodiment, the arm length of the middle arm 252 (the length between the centers of an intermediate pulley 276 and a tip-end pulley 277) is smaller than the arm length of the swivel arm 251 (the length between the centers of a base-end pulley 272 and a support pulley 273). For example, the arm length of the middle arm 252 is set to be 1/2.56 times the arm length of the swivel arm 251. The fourth embodiment is intended to move the substrate holding arm 253 along a moving locus close to a straight line as much as possible, when the multi-joint arm 203A (203B) extends/contracts. In order to achieve this, it is necessary to set the ratio of the number of teeth between the base-end pulley 272 and support pulley 273 to A:1, and set the ratio of the number of teeth between the intermediate pulley 276 and tip-end pulley 277 to 1:A/(A-1). This value A is expressed by the following formula.

$$A = 180°/\cos^{-1}\{(R1-R2)/(R1+R2)\}$$

As described above, R1=2.56R2. In this example, the ratio of the number of teeth between the base-end pulley 272 and support pulley 273 is set to, e.g., 2.74:1. The ratio of the number of teeth between the intermediate pulley 276 and tip-end pulley 277 is set to, e.g., 1:1.57.

Next, an explanation will be give of an operation of the fourth embodiment. In the first multi-joint arm 203A, the drive part 256 of a swivel shaft 270 (see FIG. 4) is stopped, while the drive part 257 of a rotation shaft 271 is activated to rotate the base-end pulley 272. This causes a rotation shaft 275 supporting the middle arm 252 to rotate. At this time, although the swivel shaft 270 is supplied with no rotation force by the drive part 256, it is in a free state (rotatable state). Accordingly, as shown in FIG. 24, when the base-end pulley 272 rotates clockwise, the middle arm 252 tries to separate from the swivel arm 251, so it rotates clockwise, and the swivel arm 251 also rotates counterclockwise.

Figure 24:
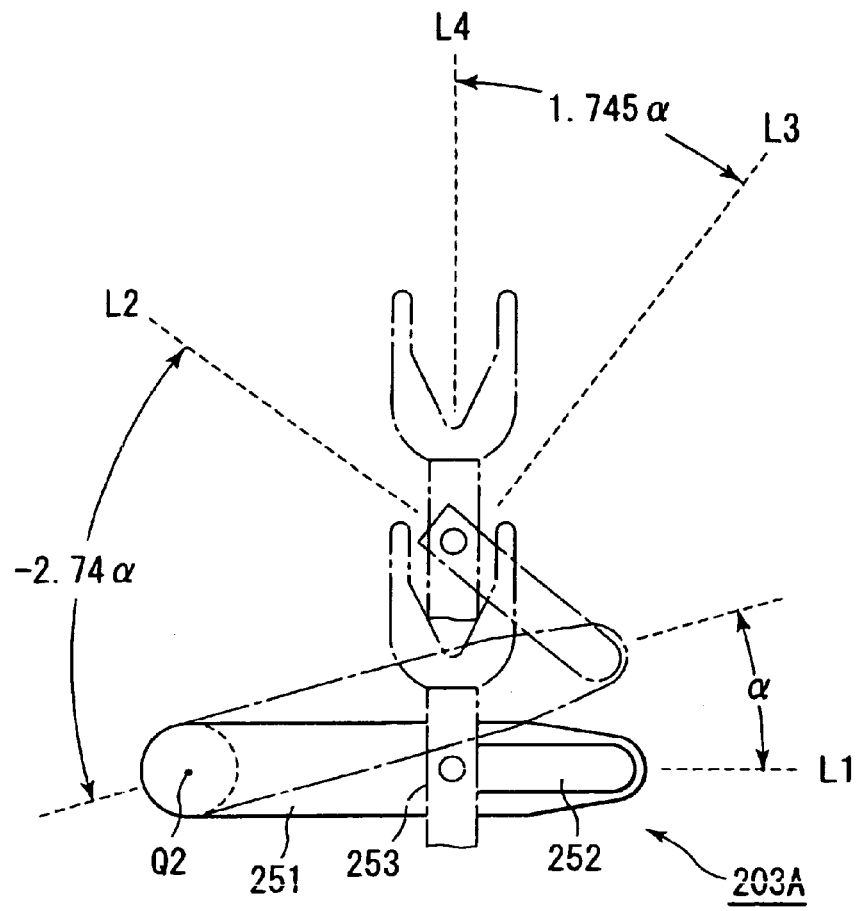
FIG. 24 is an explanatory diagram showing the principle of operation of a substrate transfer device according to the fourth embodiment of the present invention.

Also, in FIG. 24, L1 is the axial line of the swivel arm 251 (the line connecting the swivel center Q2 to the rotation center of the support pulley 273), when the first multi-joint arm 203A is in the standard position. L2 is the axial line of the middle arm 252 (the line connecting the center of the intermediate pulley 276 to the center of the tip-end pulley 277), when the swivel arm 251 rotates by α degrees. L3 is the axial line of the substrate holding arm 253 (the line connecting the center of the tip-end pulley 277 to the center of the wafer W when the substrate holding arm 253 holds the wafer W, or the centerline of the substrate holding arm 253 in its width direction), when the first multi-joint arm 203A is in the standard position. L4 is the axial line of the substrate holding arm 253 when the swivel arm 251 rotates by α degrees. Also, in FIG. 24, the other-side holding portion 255 is omitted.

Here, from the fact that the ratio of the number of teeth between the base-end pulley 272 and support pulley 273 is 2.74:1, when the swivel arm 251 rotates by α degrees from its standard position, the middle arm 252 rotates by -2.74α degrees. When the middle arm 252 rotates clockwise, the intermediate pulley 276 rotates counterclockwise relative to the middle arm 252, so the substrate holding arm 253 rotates counterclockwise. Since the ratio of the number of teeth between the intermediate pulley 276 and tip-end pulley 277 is 1:1.57, the substrate holding arm 253 rotates by 1.745α degrees.

Accordingly, as shown in FIG. 25, when the first multi-joint arm 203A is extended from its standard position and the substrate holding arm 253 is caused to advance, the locus of the substrate holding arm 253, or more particularly of the center position of the wafer W held by the substrate holding arm 253, passes through a line close to a straight line (a substantially straight line). The second multi-joint arm 203B moves in the same manner, so that the locus of the center position of the wafer W held by the substrate holding arm 263 passes through a substantially straight line. In other words, the substrate holding arms move along substantially straight lines in parallel with each other.

In the fourth embodiment, the straight line connecting the standard position of the substrate holding arm 253 to a transfer position of a wafer W and the straight line connecting the standard position of the substrate holding arm 263 to a transfer position of a wafer W are in parallel with each other. Each of the standard holding arms 253 and 263 is conceived to move along a straight line from its standard position to the corresponding transfer position of a wafer W. However, in practice, each of them moves along a curved line slightly deviating from a straight line, i.e., along a substantially straight line. The fourth embodiment also includes a design to cause each of them to move along a locus considerably deviating from a straight line, although such a design is insignificant.

When the base-end pulleys 272 and 282 rotate in reverse (rotate counterclockwise) in FIG. 25, the substrate holding arms 253 and 263 move while passing through loci symmetric with the loci in the forward direction, in the same manner.

For example, in the first multi-joint arm 203A, the drive parts 256 and 257 are activated at the same time to rotate the base-end pulley 272 and swivel shaft 270 counterclockwise from the standard position state. On the other hand, in the second multi-joint arm 203B, drive parts 266 and 267 are activated at the same time to rotate the base-end pulley 282 and swivel shaft 280 counterclockwise from the standard position state. Then, as shown in FIG. 26, the first and second multi-joint arms 203A and 203B cause a swivel motion (rotate) counterclockwise, while maintaining the standard position state indicated by solid lines in FIG. 23.

Because the second substrate transfer device 203M moves as described above, in operating the substrate processing device, transfer takes place for example as follows. Referring to FIG. 23, unprocessed wafers W are held by cassettes C and are transferred into the cassette chambers 211 and 212. The gate doors GD are closed to form an airtight space, then, for example, an inert-gas atmosphere is made. Then, the gate valves G on the inner side of the cassette chambers 211 and 212 are opened, and wafers W are simultaneously picked up from the cassette C inside the cassette chamber 211 and the cassette C inside the cassette chamber 212, and are transferred to the positioning stages 217 and 218, by the first substrate transfer device 202 inside the first transfer chamber 213, which has been given an inert-gas atmosphere. The first substrate transfer device 202 also has two multi-joint arms and is so constructed as to make it possible to transfer two wafers W simultaneously.

After the orientations of these two wafers W are aligned to the predetermined orientations, they are transferred to the preliminary vacuum chambers 314 and 315 by the first substrate transfer device 202. After the preliminary vacuum chambers 314 and 315 are set to the predetermined vacuum atmosphere, the wafers W are simultaneously transferred to the predetermined vacuum chambers 304 by the second transfer device 203M.

For example, it is assumed that vacuum processing of wafers W is completed in the vacuum chambers 304C and 304D, respectively, and wafers W to be processed next are waiting in the preliminary vacuum chambers 314 and 315. In this state, for example, the substrate holding arms 253 and 263 of the second substrate transfer device 203M simultaneously move forward in parallel with each other, as described above, and then intrude into the preliminary vacuum chambers 314 and 315, respectively, and receive the wafers W by the holding portions 255 and 265, respectively. Then, the substrate holding arms 253 and 263 intrude into the vacuum chambers 304C and 304D, respectively, and receive the wafers W by the holding portions 254 and 264, respectively.

Thereafter, the second substrate transfer device 203M swivels by 180 degrees (more particularly, the swivel arms 251 and 261 swivel by 180 degrees), as described with reference to FIG. 26. Then, the processed wafers W held by the substrate holding portions 254 and 264 are transferred to the preliminary vacuum chambers 314 and 315, respectively. Also, the unprocessed wafers W held by the substrate holding portions 255 and 265 are transferred into the vacuum chambers 304C and 304D, respectively.

The wafers W transferred into the preliminary vacuum chambers 314 and 315, respectively, are for example simultaneously returned into the cassette chambers 211 and 212 by the first substrate transfer device 202. The explanation given above refers to the vacuum chambers 304C and 304D. If vacuum processing of the wafers has been completed in, for example, the vacuum chambers 304A and 304B, wafer replacement is done in the same way.

There is a case where the first process is performed within two vacuum chambers, e.g., 304A and 304B, disposed on one side of the second transfer chamber 316, the second process is performed within two vacuum chambers, e.g., 304C and 304D, disposed on another side, and the third process is performed within two vacuum chambers, e.g., 304E and 304F, disposed on still another side. In this case, for example, two wafers W having subjected to the first process in the vacuum chambers 304A and 304B are simultaneously transferred to the vacuum chambers 304C and 304D, respectively, by the second substrate transfer device 203M. Then, the two wafers W having subjected to the second process in the vacuum chambers 304C and 304D are simultaneously transferred to the vacuum chambers 304E and 304F.

There is a case where the vacuum chamber 304A cannot be available due to trouble or maintenance. In this case, for example, two wafers W are simultaneously transferred to each set of the vacuum chambers 304C and 304D, and the vacuum chamber 304E and 304F, but only one wafer W is transferred to the vacuum chamber 304B by one of the first and second multi-joint arms 203A and 203B being caused to extend/contract.

In the fourth embodiment described above, the substrate holding arm 253 of the first multi-joint arm 203A and the substrate holding arm 263 of the second multi-joint arm 203B move back and forth along straight lines from their standard positions, which are located on the left and right sides of the swivel center Q2. This arrangement allows wafers W to be together transferred to two vacuum chambers 304 and 304 disposed on one side. As a consequence, the transfer efficiency becomes high, thereby performing high-throughput processing. The term "together" used here includes not only a case where two wafers W are simultaneously transferred, but also a case where the first and second multi-joint arms 203A and 203B extend/contract in a sequential order. In addition, since a small swivel radius suffices, it is possible to make a small transfer area, resulting in a compact apparatus.

The first and second multi-joint arms 203A and 203B can extend/contract independently. Accordingly, even in a case where one of two vacuum chambers 304 and 304 disposed on one side is not used, the other chamber 304 can be used. This arrangement provides high flexibility in operation mode, resulting in flexible management. Further, each of the substrate holding arms 253 and 263 for supporting substrates has the holding portions (254, 255) or (264, 265) on both ends and can hold wafers W two at a time. This arrangement allows the frequency of swivel operations to be reduced, and in this respect too, transferring can be done with high efficiency. Furthermore, since the second substrate transfer device 203M employs multi-joint arms, the structure can be simple with a low cost.

In the structure shown in FIG. 23, although two vacuum chambers 304 and 304 are disposed on each side of the second transfer chamber 316, this embodiment may be applied to a case where one vacuum chamber has two transfer ports. In this case, even if one of two transfer ports is in a state where its gate valve cannot be opened, the other transfer port can be used to transfer a wafer W to the vacuum chamber by one of the first and second multi-joint arms 203A and 203B being caused to extend/contract.

Figure 27:
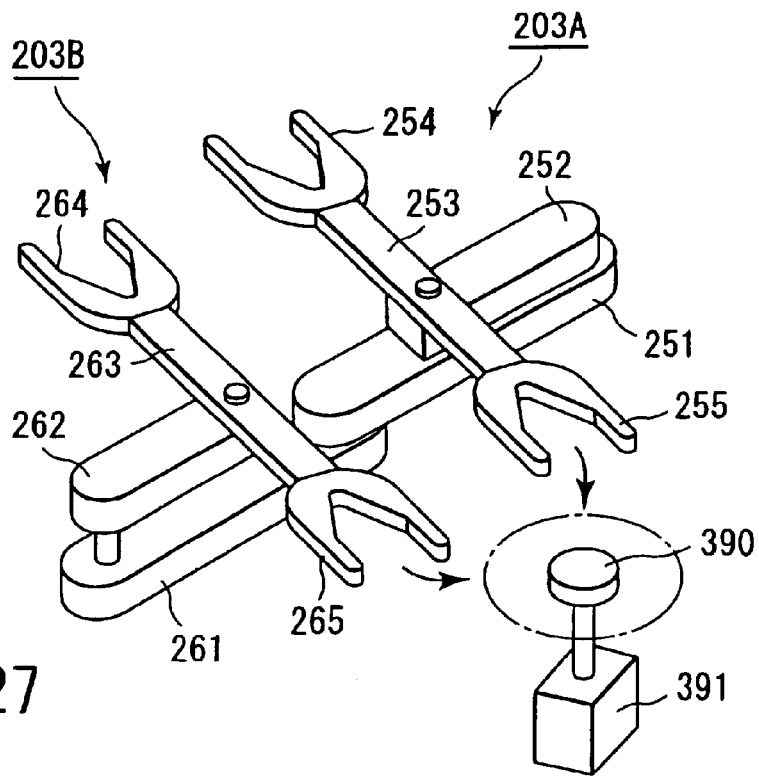
FIG. 27 is a schematic view showing a substrate processing apparatus according to a modification of the fourth embodiment.
Figure 28:
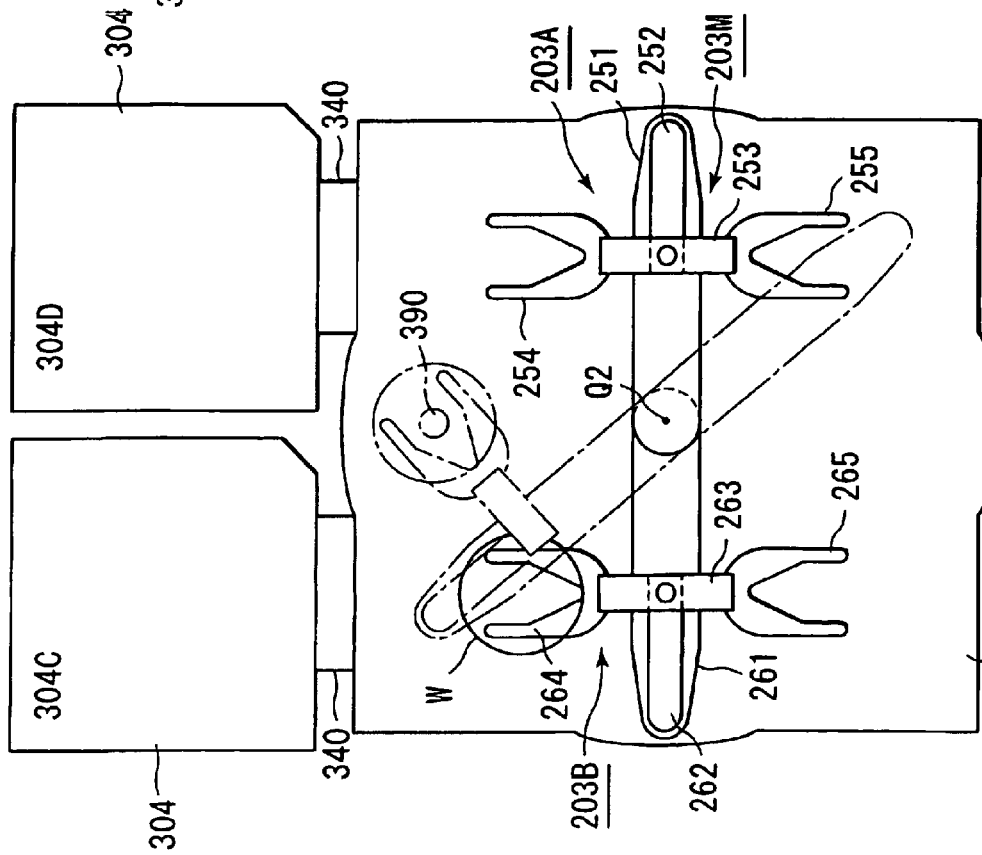
FIG. 28 is an explanatory diagram showing a manner where a wafer is transferred between substrate holding arms in the substrate processing apparatus shown in FIG. 27.

As shown in FIGS. 27 and 28, the second transfer chamber 316 may be preferably provided with a buffer worktable 390 therein as a buffer support portion, which is movable up and down by an elevating member 391. The buffer worktable 390 is located on the moving loci (the moving loci in the plan view) of wafers W held by the first and second substrate holding arms 253 and 263, when the first and second multi-joint arms 203A and 203B swivel. In this embodiment, the buffer worktable 390 is located on the moving loci of the substrate holding portions 254, 255, 264, and 265.

This arrangement allows a wafer W to be transferred between the first and second substrate holding arms 253 and 263 via the buffer worktable 390. For example, as shown in FIG. 28, it is assumed that the holding portion 264 of the second substrate holding arm 263 holds a wafer W. In this case, the first and second multi-joint arms 203A and 203B are caused to swivel to position the wafer W held on the second substrate holding arm 263 above the buffer worktable 390. Then, the buffer worktable 390 is moved up to pass through the opening of the fork portion or holding portion 264 of the second substrate holding arm 263 and receive the wafer W. Then, the first and second multi-joint arms 203A and 203B are caused to swivel to position the holding portion 254 of the first substrate holding arm 253 directly below the wafer W. Then, the buffer worktable 390 is moved down to place the wafer W on the first substrate holding arm 253 from the buffer worktable 390.

This arrangement allows an operation as described below for example, resulting in further flexible management. Specifically, a wafer W is processed in one of two vacuum chambers 304 and 304 disposed on one side of the second transfer chamber 316, and is then taken out by one of the first and second substrate holding arms 253 and 263. Then, the wafer W is transferred to the other of the first and second substrate holding arms 253 and 263 via the buffer worktable 390. Then, the wafer W is transferred to the other of the two vacuum chambers 304 and 304. By doing so, the vacuum chambers 304 and 304 adjacent to each other on one side can be used to perform continuing combination of processes.

Figure 29:
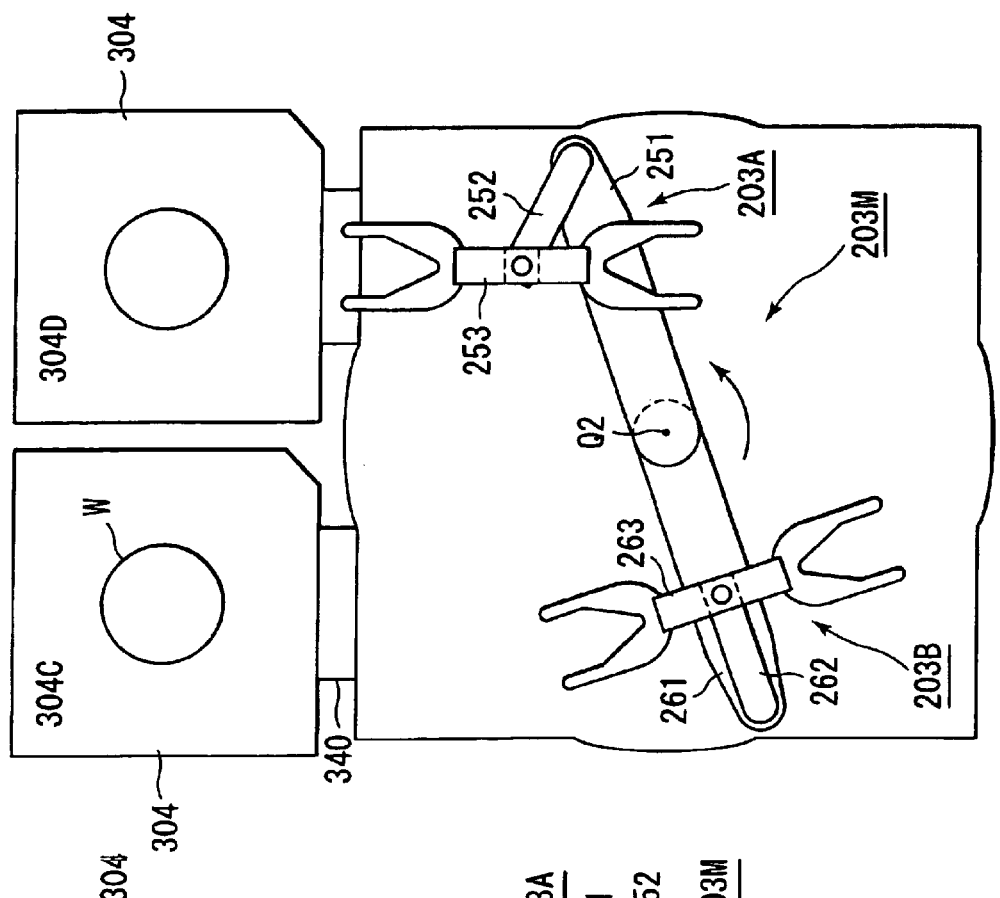
FIG. 29 is a plan view showing a substrate processing apparatus according to another modification of the fourth embodiment.

The fourth embodiment described above has a structure in which the first multi-joint arm 203A and second multi-joint arm 203B have swivel shafts independent of each other, but they may have a swivel shaft in common. For example, the first and second swivel arms 251 and 261 may be driven by a common drive part. For example, the first and second swivel arms 251 and 261 may be unified. FIG. 29 shows an example of an operation where they have a swivel shaft in common. Incidentally, each of the first multi-joint arm 203A and second multi-joint arm 203B may be formed of a combination of four or more arms, in place of a combination of three arms.

In the substrate transfer device according to the fourth embodiment, the first and second multi-joint arms are employed so that the second substrate holding arms extend/contract side by side along straight lines or lines close to straight lines. Accordingly, the arms can hold the two substrates at a time by a transfer operation of handling two substrates simultaneously or in a sequential order, thereby attaining high transfer efficiency. Furthermore, since they are multi-joint arms, the structure can be simple with a low cost. Since the first and second substrate holding arms can move back and forth independently of each other, the operation mode is very flexible, such that, for example, a wafer is transferred to only one of two chambers disposed side by side. As a consequence, the substrate transfer device according to the fourth embodiment provides high throughput, high flexibility in operation mode, resulting in flexible management.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A controlling method of controlling a chiller that supplies a cooling medium for temperature control to a processing apparatus for performing a predetermined process on a substrate, the controlling method comprising:

supplying the cooling medium at a first flow rate to the processing apparatus from the chiller when the processing apparatus ordinarily operates for the process;

referring to recipe information on a process sequence, thereby detecting that the processing apparatus will come into a long idle state that is an idle state longer than a predetermined threshold time period;

reducing a flow rate of the cooling medium from the first flow rate to a second flow rate smaller than the first flow rate after the processing apparatus switches from an ordinary operation state to the idle state; and returning the flow rate of the cooling medium back to the first flow rate from the second flow rate before the processing apparatus switches from the idle state to the ordinary operation state.

2. The method according to claim 1, wherein an electrode is disposed in the processing apparatus and configured to be supplied with a radio frequency power, and the cooling medium is supplied to the processing apparatus from the chiller to control temperature of the electrode.

3. The method according to claim 2, wherein the substrate is placed on the electrode.

4. The method according to claim 2, wherein the electrode is supplied with no radio frequency power when the processing apparatus is in the idle state.

5. The method according to claim 4, wherein the second flow rate of the cooling medium is set to be a flow rate at which the electrode is kept at a temperature almost equal to an electrode temperature set value used when the processing apparatus is in the ordinary operation state.

6. The method according to claim 2, wherein plasma is generated near the electrode by supply of the radio frequency power.

7. The method according to claim 1, wherein the threshold time period is set to be longer than a time period that is a sum of a first time period necessary for switching from the first flow rate to the second flow rate, and a second time period necessary for switching from the second flow rate to the first flow rate.

8. The method according to claim 7, wherein, when the processing apparatus shifts from the long idle state to the ordinary operation state, a switching operation from the second flow rate to the first flow rate is started, the second time period or more earlier than timing to shift to the ordinary operation state.

9. The method according to claim 8, comprising referring to recipe information on a process sequence, thereby detecting the timing to shift to the ordinary operation state.

10. A controlling apparatus for controlling a chiller that supplies a cooling medium for temperature control through a cooling medium circulation passage to a processing apparatus for performing a predetermined process on a substrate, the controlling apparatus comprising:

cooling medium flow rate adjusting means for adjusting a flow rate of the cooling medium supplied from the chiller to the processing apparatus;

first sequence detecting means for referring recipe information on a process sequence, thereby detecting that the processing apparatus will come into a long idle state that is an idle state longer than a predetermined threshold time period;

cooling medium flow rate reducing means for controlling, in accordance with a detection result obtained by the first sequence detecting means, the cooling medium flow rate adjusting means to reduce a flow rate of the cooling medium from a first flow rate for an ordinary operation state of the processing apparatus to a second flow rate smaller than the first flow rate after the processing apparatus switches from the ordinary operation state to the idle state; and cooling medium flow rate returning means for controlling the cooling medium flow rate adjusting means to return the flow rate of the cooling medium back to the first flow rate from the second flow rate before the processing apparatus switches from the idle state to the ordinary operation state.

11. The apparatus according to claim 10, wherein the threshold time period is set to be longer than a time period that is a sum of a first time period necessary for switching from the first flow rate to the second flow rate, and a second time period necessary for switching from the second flow rate to the first flow rate.

12. The apparatus according to claim 11, wherein, when the processing apparatus shifts from the long idle state to the ordinary operation state, the cooling medium flow rate returning means starts a switching operation from the second flow rate to the first flow rate, the second time period or more earlier than timing to shift to the ordinary operation state.

13. The apparatus according to claim 12, comprising second sequence detecting means for referring to recipe information on a process sequence, thereby detecting the timing to shift to the ordinary operation state, and supplying a detection result to the cooling medium flow rate returning means.

14. A semiconductor processing system, comprising:
a processing apparatus configured to perform a predetermined semiconductor process on a substrate, the processing apparatus including a process chamber that accommodates the substrate, a susceptor that supports the substrate in the process chamber, a gas supply section that supplies a process gas into the process chamber, and an exhaust section that exhausts an interior of the process chamber;

a thermo-medium circulation apparatus configured to circulate a thermo-medium through the susceptor to control temperature of the susceptor; and a control section to control an operation of the processing apparatus and the thermo-medium circulation apparatus, wherein the control section switches the thermo-medium circulation apparatus between an ordinary mode and an energy-saving mode in correspondence with an ordinary operation state and a long idle state of the processing apparatus, respectively, the long idle state is an idle state of the processing apparatus longer than a predetermined threshold time period, and the thermo-medium is circulated at a first flow rate and at a second flow rate smaller than the first flow rate in the ordinary mode and the energy-saving mode, respectively, wherein the control section refers to recipe information on a process sequence, thereby detects that the processing apparatus will shift from the ordinary operation state to the long idle state, and switches the thermo-medium circulation apparatus from the ordinary mode to the energy-saving mode after the processing apparatus shifts to the long idle state, and wherein the control section refers to recipe information on the process sequence or another process sequence, thereby detects that the processing apparatus will shift from the long idle state to the ordinary operation state, and switches the thermo-medium circulation apparatus from the energy-saving mode to the ordinary mode before the processing apparatus shifts to the ordinary operation state.

15. The system according to claim 14, wherein the threshold time period is set to be longer than a time period that is a sum of a first time period necessary for switching from the ordinary mode to the energy-saving mode, and a second time period necessary for switching from the energy-saving mode to the ordinary mode.

16. The system according to claim 14, wherein, when the processing apparatus shifts from the long idle state to the ordinary operation state, the control section starts a switching operation from the second flow rate to the first flow rate, the second time period or more earlier than timing to shift to the ordinary operation state.

17. The system according to claim 14, wherein the control section sets an interior of the process chamber at a vacuum pressure of 0.1 to 1 mTorr in the long idle state.

18. The system according to claim 14, wherein the processing apparatus comprises a plasma exciting mechanism configured to turn the process gas into plasma, and the control section disables the plasma exciting mechanism in the long idle state.

19. The system according to claim 18, wherein the plasma exciting mechanism comprises an upper electrode and a lower electrode facing each other, and a power supply configured to supply a radio frequency power across the upper electrode and the lower electrode, and the lower electrode functions as the susceptor.

20. The system according to claim 18, wherein the thermo-medium is a cooling medium.

\* \* \* \* \*